(12) United States Patent
Fukuoka et al.

(10) Patent No.: US 10,459,339 B2
(45) Date of Patent: Oct. 29, 2019

(54) RESIST PATTERN FORMING METHOD, COATING AND DEVELOPING APPARATUS AND STORAGE MEDIUM

(71) Applicant: TOKYO ELECTRON LIMITED, Tokyo (JP)

(72) Inventors: Tetsuo Fukuoka, Koshi (JP); Yoshio Kimura, Koshi (JP); Gousuke Shiraishi, Koshi (JP)

(73) Assignee: Tokyo Electron Limited, Minato-ku (JP)

( * ) Notice: Subject to any disclaimer, the term of this patent is extended or adjusted under 35 U.S.C. 154(b) by 132 days.

(21) Appl. No.: 14/889,564

(22) PCT Filed: May 8, 2014

(86) PCT No.: PCT/JP2014/062384
§ 371 (c)(1),
(2) Date: Nov. 6, 2015

(87) PCT Pub. No.: WO2014/181837
PCT Pub. Date: Nov. 13, 2014

(65) Prior Publication Data
US 2016/0085154 A1  Mar. 24, 2016

(30) Foreign Application Priority Data
May 10, 2013  (JP) .................................. 2013-100693

(51) Int. Cl.
*G03F 7/16* (2006.01)
*G03F 7/38* (2006.01)
(Continued)

(52) U.S. Cl.
CPC ................ *G03F 7/16* (2013.01); *G03F 7/203* (2013.01); *G03F 7/38* (2013.01); *G03F 7/40* (2013.01)

(58) Field of Classification Search
None
See application file for complete search history.

(56) References Cited

U.S. PATENT DOCUMENTS

2008/0169279 A1   7/2008  Fukuoka et al.
2010/0167207 A1*  7/2010  Tanaka .................. G03F 7/0045
                                                   430/286.1
(Continued)

FOREIGN PATENT DOCUMENTS

JP    07-297096 A1    11/1995
JP    2004-327688 A1  11/2004
(Continued)

OTHER PUBLICATIONS

Taiwanese Office Action (Application. No. 103115809) dated Feb. 22, 2016.
(Continued)

*Primary Examiner* — Mark F. Huff
(74) *Attorney, Agent, or Firm* — Burr & Brown, PLLC

(57) ABSTRACT

This resist pattern forming method comprises: a step for coating a substrate with a chemically amplified resist; a subsequent step for forming a latent image of a pattern by exposing the resist film on the substrate; a subsequent step for irradiating the exposed resist film selectively with infrared light from a first heating source having wavelengths 2.0-6.0 μm; a subsequent step for heating the substrate by means of a second heating source that is different from the first heating source for the purpose of diffusing an acid that is produced in the resist film by exposure; and a subsequent step for forming a pattern of the resist film by supplying a developer liquid to the substrate. Consequently, roughening of sidewalls of the resist pattern can be suppressed.

9 Claims, 22 Drawing Sheets

(51) Int. Cl.
G03F 7/20 (2006.01)
G03F 7/40 (2006.01)

(56) References Cited

U.S. PATENT DOCUMENTS

2011/0189602 A1   8/2011   Tadokoro et al.
2012/0140191 A1   6/2012   Hontake et al.

FOREIGN PATENT DOCUMENTS

| | | |
|---|---|---|
| JP | 2008-159768 A1 | 7/2008 |
| JP | 2008-177300 A1 | 7/2008 |
| JP | 2011-099956 A1 | 5/2011 |
| JP | 2011-165693 A1 | 8/2011 |
| JP | 2011-204774 A1 | 10/2011 |
| JP | 2013-069962 A1 | 4/2013 |
| TW | 201106108 A1 | 2/2011 |

OTHER PUBLICATIONS

International Search Report (Application No. PCT/JP2014/062384) dated May 8, 2014.

* cited by examiner

RESIST PATTERN FORMING METHOD, COATING AND DEVELOPING APPARATUS AND STORAGE MEDIUM

BACKGROUND OF THE INVENTION

1. Field of the Invention

The present invention relates to a resist pattern forming method and a coating and developing apparatus that apply a resist to a substrate and develop the substrate, and also relates to a storage medium storing computer program used for the apparatus.

2. Description of Related Art

In a fabricating process of a semiconductor device or LCD substrate, a resist film is formed on the surface of a substrate such as a semiconductor wafer (hereinafter referred to as "wafer") and then it is exposed, and thereafter a developing process is performed, whereby a patterned mask of the resist film is formed. The sidewalls of the resist pattern in the patterned mask are rough, which causes variation of the line width of the pattern. When etching is performed in a later process step, if degree of the roughness is large, the line width of the pattern formed in a film underlying the resist film may be adversely affected.

It has been considered the use of extreme ultraviolet (EUV) light having a relatively short wavelength to form a fine pattern in exposure apparatuses for performing the exposure. The EUV is likely to be attenuated as compared with ArF (Argon fluoride) excimer laser that has been used in the exposure apparatuses. It is thus required to provide a method that can form a resist pattern with high resolution even under low exposure energy.

Patent document 1 describes a heating apparatus having a heating lamp that emits infrared light, and irradiates a half of an exposed wafer with infrared light before the wafer is placed on a heating plate so as to form temperature distribution. Patent document 2 describes a heating apparatus that irradiates infrared light of wavelengths within a range of 0.85 to 1 μm to heat a wafer comprising silicon, thereby to preform PEB. These documents, however, do not provide a solution to the aforementioned problem.

PRIOR ART DOCUMENTS

Patent Documents

Patent Document 1: JP2008-177300A
Patent Document 2: JP2011-165693A

SUMMARY OF THE INVENTION

The object of the present invention is to provide a technique to suppress the roughness of sidewalls of a resist pattern.

A resist pattern forming method in a preferred embodiment of the present invention comprises: a step of applying a chemically amplified resist to a substrate; a step of, after the step of applying the resist, exposing a resist film formed on the substrate thereby forming a latent image of a pattern; a step of, after the step of exposing the resist film, irradiating from a first heating source the resist film with infrared light of wavelengths from 2.0 to 6.0 μm selectively; a step of, after the step of irradiating the resist film with the infrared light, heating the substrate by means of a second heating source that is different from the first heating source thereby diffusing acids that are produced in the resist film by the exposing; and a step of, after the step of heating the substrate, forming a pattern of the resist film by supplying a developer to the substrate.

A resist pattern forming method in another preferred embodiment of the present invention comprises: a step of applying a resist to a substrate; a step of, after the step of applying the resist, irradiating from a first heating source the resist film formed on the substrate with infrared light of wavelengths from 2.0 to 6.0 μm selectively, and heating the substrate, being irradiated with the infrared light, by means of a second heating source that is different from the first heating source thereby drying the resist film; a step of, after the step of irradiating the resist film with the infrared light and heating the substrate being irradiated with the infrared light, exposing the resist film on the substrate thereby forming a latent image of a pattern; a step of, after the step of exposing the resist film, heating the exposed substrate; and a step of, after the step of heating the exposed substrate, forming a pattern of the resist film by supplying a developer to the substrate.

By irradiating from the first heating source an exposed chemically amplified resist film with infrared light of wavelengths from 2.0 to 6.0 μm selectively, and then heating the resist film by the second heating source, a roughness on sidewalls of the resist pattern can be suppressed, as shown by the below evaluating experiments. In addition, an exposure energy supplied to an area to be exposed for resolving the pattern can be decreased. The reason is considered that acids, which were produced by the exposure by the infrared light of the aforementioned wavelengths, have flown in the resist film.

In addition, while irradiating from the first heating source the resist film before being exposed with infrared light of wavelengths from 2.0 to 6.0 μm selectively, by heating the substrate by the second heating source to dry the resist film, a roughness on the sidewalls of the resist pattern can be suppressed, as shown by the below evaluating experiments. The reason is considered that variation of temperature distribution of the resist film, which is caused by the second heating source, is suppressed by the infrared light of the aforementioned wavelengths, whereby aggregation of particles of the resist can be prevented.

DETAILED DESCRIPTION OF THE INVENTION

First Embodiment

Figure 1:
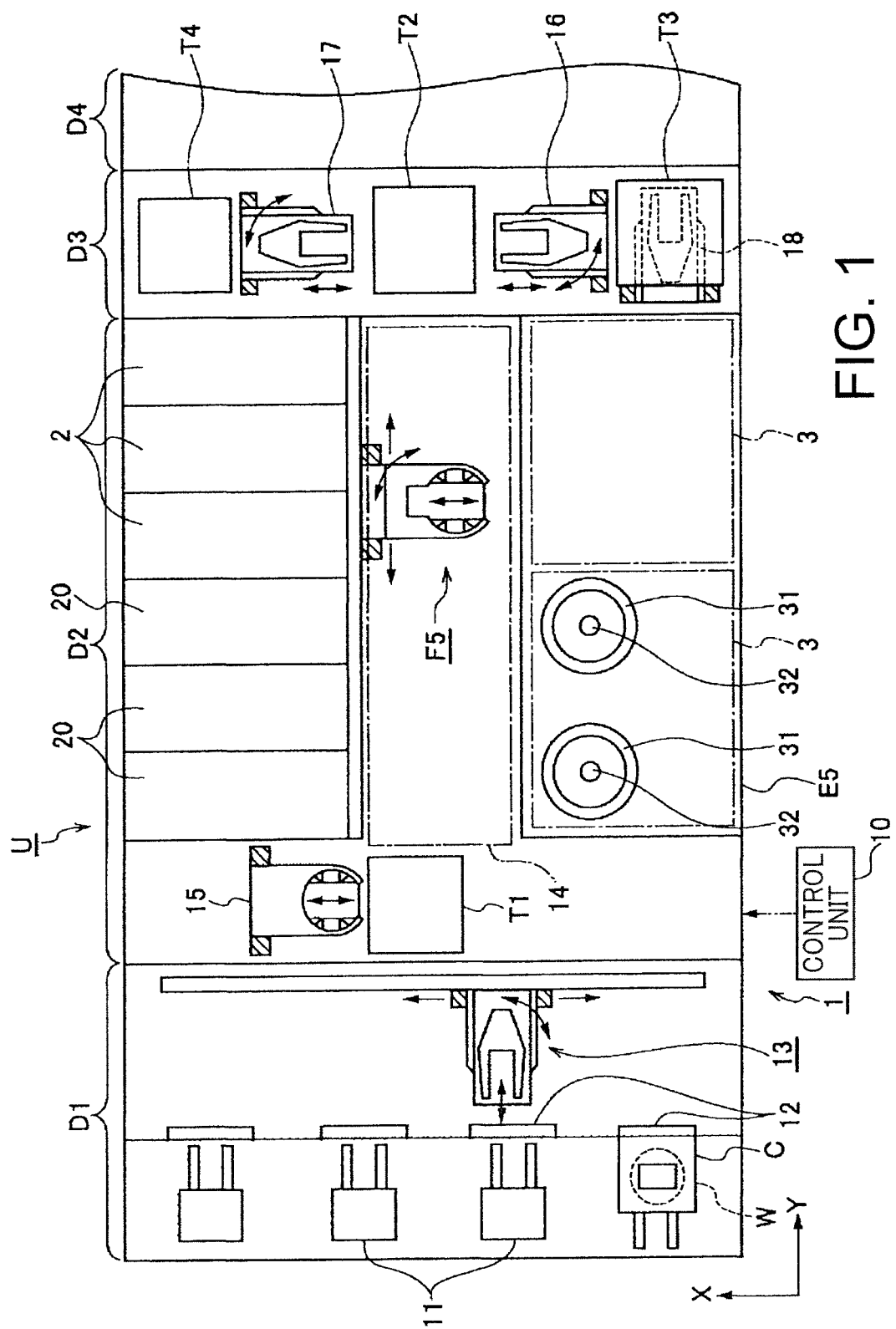
FIG. 1 is a plan view of a coating and developing apparatus that performs a coating and developing method according to the present invention.
Figure 2:
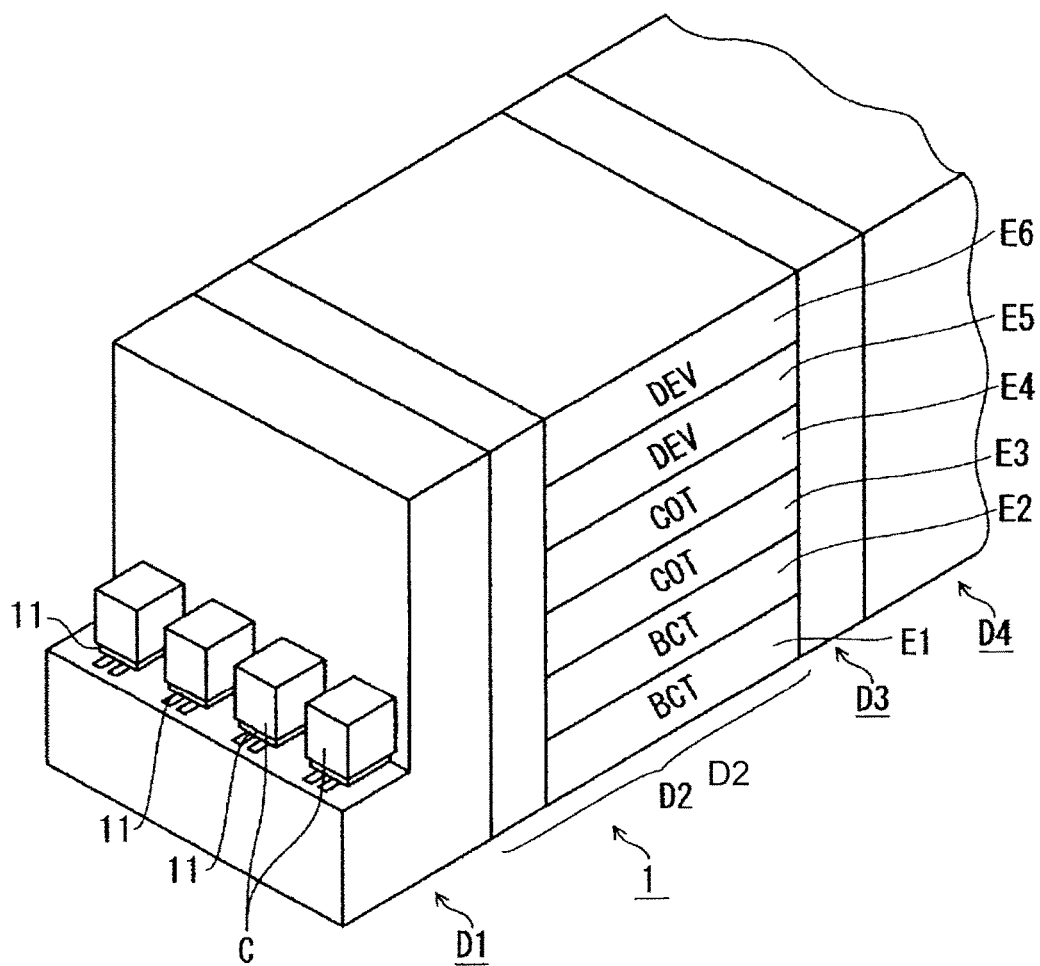
FIG. 2 is a schematic perspective view of the coating and developing apparatus.
Figure 3:
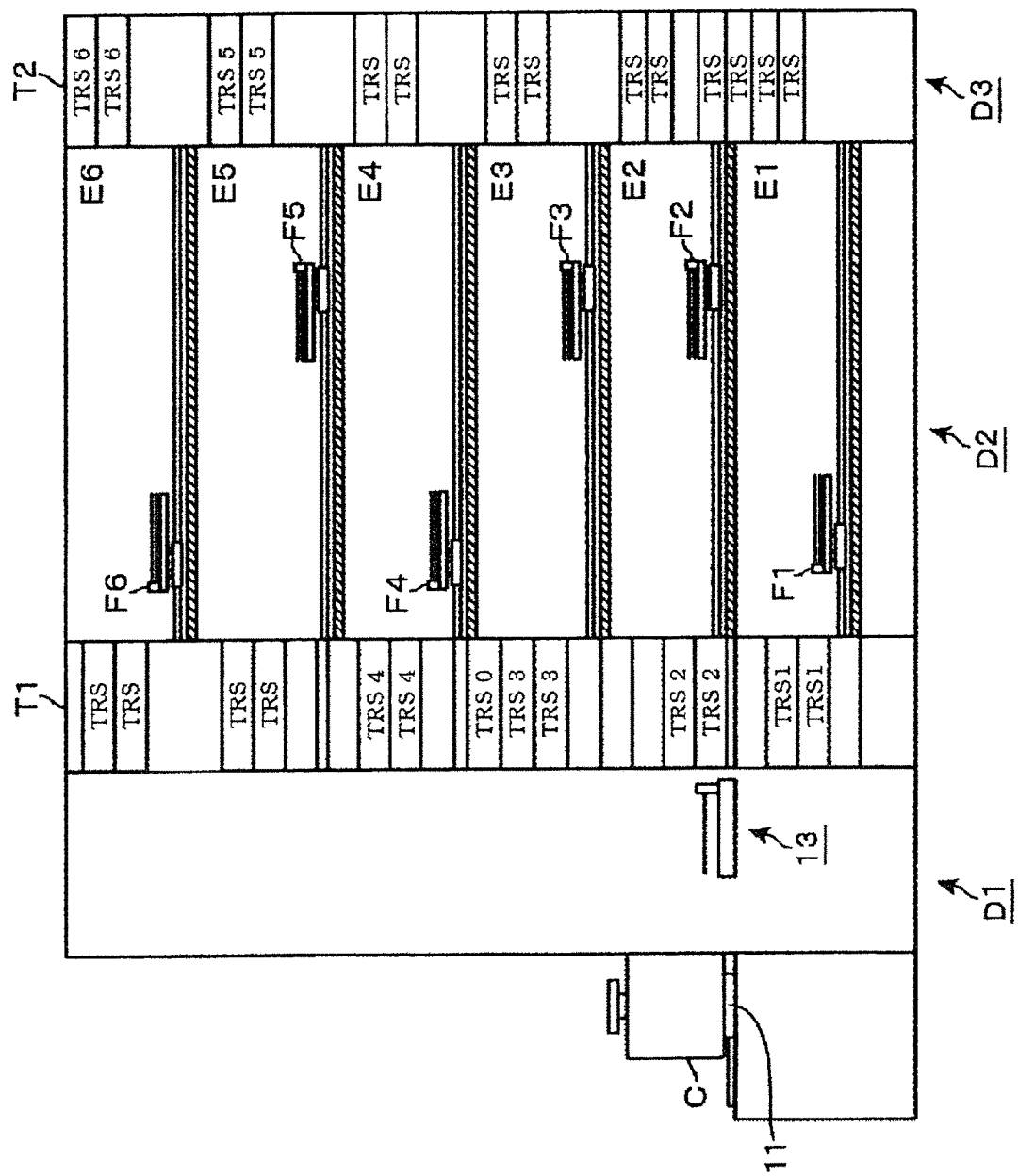
FIG. 3 is a vertically-sectioned side view of the coating and developing apparatus.

A coating and developing apparatus 1 in a first embodiment of the present invention for carrying out a resist pattern forming method is explained. FIGS. 1, 2 and 3 are a plan view, a perspective view and a vertically-sectioned side view of the coating and developing apparatus 1, respectively. The coating and developing apparatus 1 is composed of a carrier block D1, a process block D2 and an interface block D3 that are connected in line. In addition, an exposure apparatus D4 is connected to the interface block D3. In the below description, the direction in which the blocks D1 to D3 are arranged (Y direction in FIG. 1) is referred to as the back and forth direction. The carrier block D1 has a function for loading and unloading a carrier C containing a plurality of wafers W to and from the coating and developing apparatus 1. The carrier block D1 includes a table 11 for the carrier C, an opening and closing part 12 and a transfer mechanism 13 for transporting the wafers W from the carrier C through the opening and closing part 12.

The process block D2 is formed by stacking first to sixth unit blocks E1 to E6 that perform a liquid process to the wafers W. For the convenience of explanation, a process for forming an underlying antireflection film on the wafer W may be expressed as "BCT", a process for forming a resist film on the wafer W may be expressed as "COT", and a process for forming a resist pattern on the exposed wafer W may be expressed as "DEV". In this embodiment, as shown in FIG. 2, two BCT layers, two COT layers and two DEV layers are stacked in this order from below. In the unit blocks of the same type, the wafers W are transported and processed in parallel.

The unit block E5 is explained as a representative of these unit blocks, with reference to FIG. 1. A shelf unit U is disposed on one of the right and left sides of a transport area 14 extending from the carrier block D1 toward the interface block D3. The shelf unit U is formed by arranging, e.g., six stacks in the back and forth direction, each stack including two heating modules that are stacked vertically. Among these heating modules, the heating modules for performing a heating process (which is referred to as PEB (Post Exposure Bake) process) to the wafer W that has been exposed but has not been developed yet, are indicated by reference numeral 2, and the heating modules for performing a heating process to the developed wafer W are indicated by reference numeral 20. The structure of the heating module 2 is described later. The heating module 20 and the heating module 2 have substantially the same structure, excluding that the heating module 20 is not equipped with an infrared lamp and a filter, which are described later.

Two developing modules 3 are arranged in the back and forth direction on the other of the right and left sides of the transport area 14. Each developing module 3 includes cups 31, 31 arranged in the back and forth direction. The wafer W is placed on a chuck 32 in the cup 31. A not-shown nozzle is moved between the cups 31, 31. A developer is supplied from the nozzle onto the surface of the wafer W in each cup 31, so that a resist film on the surface of the wafer W is developed.

The transport area 14 is provided with a transport arm F5 serving as a wafer transport mechanism. The transport arm F5 can deliver the wafer W among the cup 31, the heating module 2, and transition modules TRS located at the height level of the unit block E5 in towers T1 and T2 described later.

The unit block E6 has the same structure as that of the unit block E5. The unit blocks E1 and E2 have the same structure as that of the unit block E5, excluding that each unit block E1, E2 is provided with an antireflection film forming module instead of the developing module 3, and that all the heating modules of the heating unit U are the heating modules 20. The antireflection film forming module has the same structure as that of the developing module 3, excluding that the antireflection film forming module supplies from its nozzle a chemical liquid for forming an antireflection film, instead of the developer.

Each unit block E3, E4 is provided with a resist coating module instead of the developing module 3. The resist coating module has the same structure as that of the developing module 3, excluding that the resist coating module supplies from its nozzle a chemically-amplified positive resist, instead of the developer. In the first embodiment, all the heating modules in each unit block E3, E4 are the heating modules 20. Except for the aforementioned differences, each unit block E3, E4 has the same structure as that of the unit block E5. The heating module 20 in each unit block E3, E4 volatilizes and removes a solvent contained in a resist film formed on the wafer W by heating the wafer W, thereby to perform a pre-applied bake (PAB) process for drying the resist film. In FIG. 3, transport arms of the unit blocks E1 to E4 and E6, which correspond to the transport arm F5 of the unit block E5, are indicated by the reference numerals F1 to F4 and F6, respectively.

On the carrier block D1 side of the process block D2, there are disposed the tower T1 vertically extending across the unit blocks E1 to E6, and a transfer arm 15 that is an elevating transfer mechanism for sending and receiving the wafer W to and from the tower T1. The tower T1 is composed of a plurality of modules that are stacked on one another. The modules disposed at the respective height levels of the unit blocks E1 to E6 can send and receive the wafer W to and from the respective transport arms F1 to F6 of the unit blocks E1 to E6. These modules actually include the transition modules TRS disposed at height positions of the respective unit blocks, temperature regulating modules that each regulate the temperature of the wafer W, buffer modules that each temporarily store a plurality of the wafers W, hydrophobizing modules that each hydrophobize the surface of the wafer W, and so on. To simplify the explanation, illustration of the hydrophobizing module, the temperature regulating module and the buffer module is omitted.

The interface block D3 has towers T2, T3, T4 vertically extending across the unit blocks E1 to E6. The interface block D3 is equipped with an interface arm 16 that is an elevating transfer mechanism for transporting the wafer W between the tower T2 and the tower T3, an interface arm 17 that is an elevating transfer mechanism for transporting the wafer W between the tower T2 and the tower T4, and an interface arm 18 for transporting the wafer W between the tower T2 and the exposure apparatus D4.

The tower T2 is formed by stacking transition modules TRS, buffer modules that each store and accumulate a plurality of the wafers that have not been exposed yet, buffer modules that each store a plurality of the exposed wafers W, temperature regulating modules that each regulate the temperature of the wafer W, etc., on one another. Illustration of the buffer modules and the temperature regulating modules is omitted. In the coating and developing apparatus 1, a place where the wafer W is placed is referred to as a module. Although the towers T3, T4 are also respectively equipped with modules, explanation thereof is omitted. For example, the exposure apparatus D4 exposes a resist film on the wafer W through a mask having apertures that are formed according to a predetermined pattern.

Figure 4:
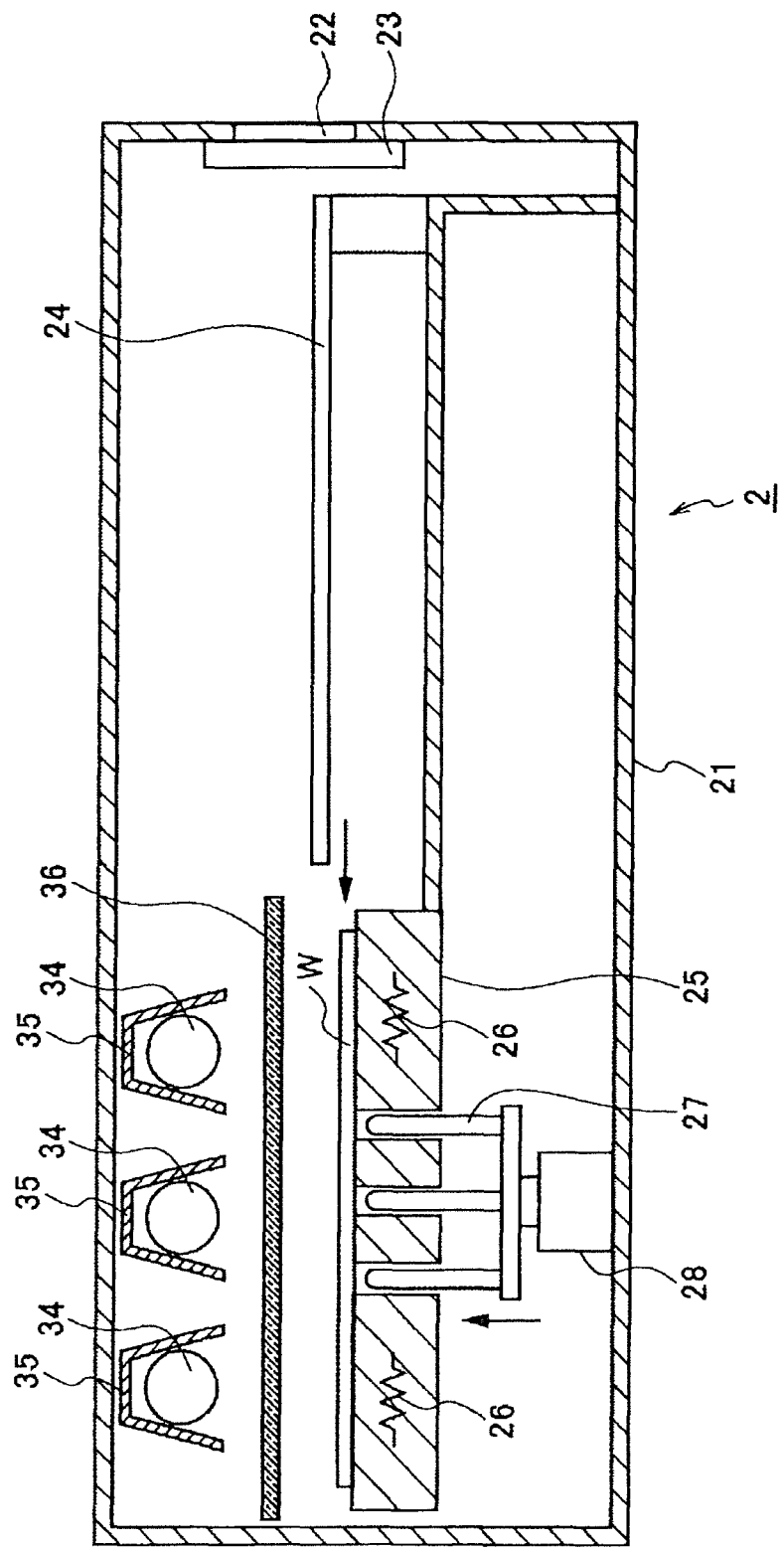
FIG. 4 is a vertically-sectioned side view of a heating module provided in the coating and developing apparatus.
Figure 5:
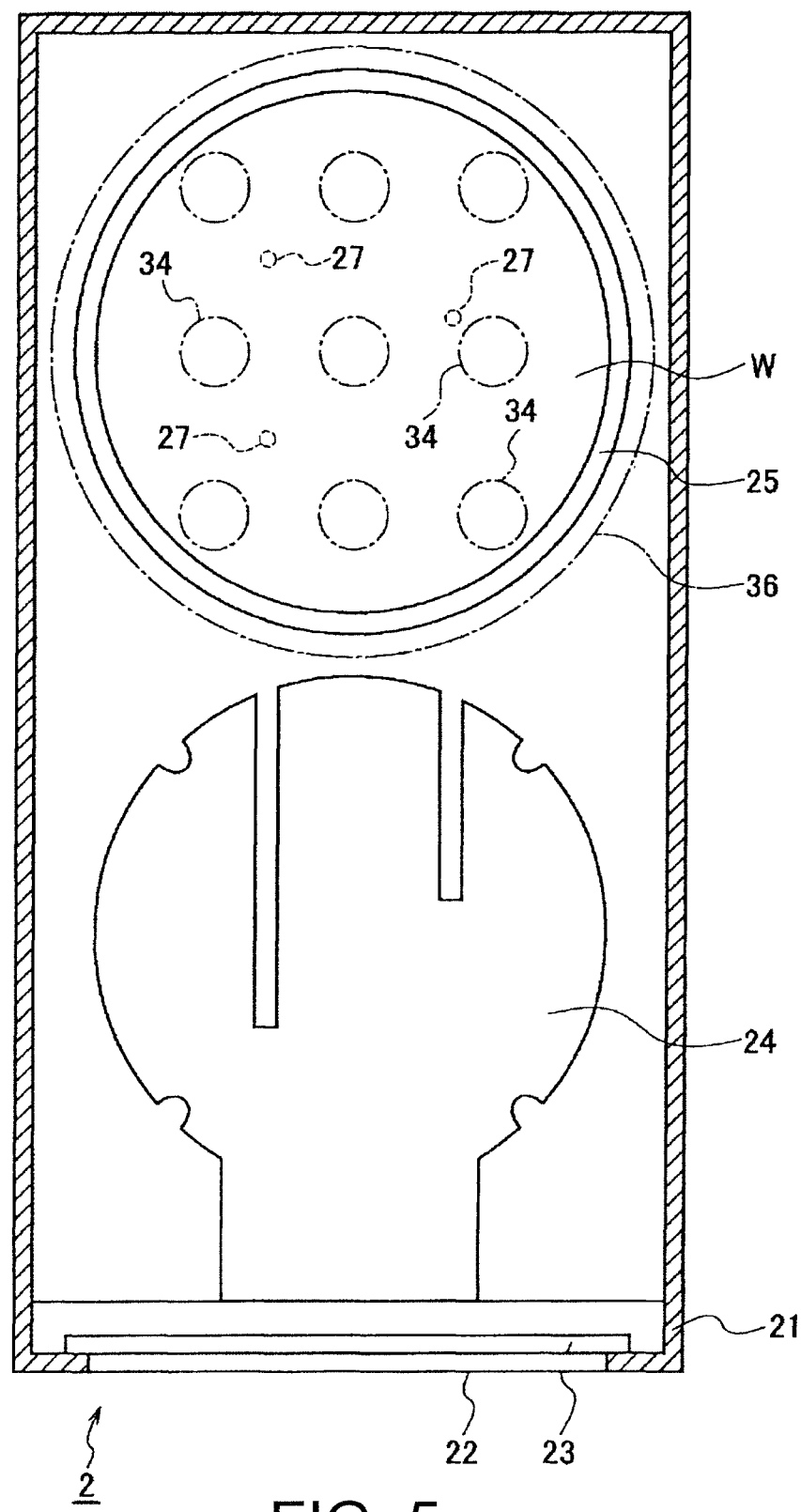
FIG. 5 is a laterally-sectioned side view of the heating module.

Next, the structure of the heating module 2 for performing the PEB process is explained with reference to the vertically-sectioned view of FIG. 4 and the laterally-sectioned view of FIG. 5. In the drawings, the reference numeral 21 indicates a housing having a transport opening 22 for the wafer W, which faces the transport area 14. The reference numeral 23 indicates a shutter that opens and closes the transport opening 22. The reference numeral 24 indicates a horizontal cooling plate that can be moved by a not-shown drive mechanism, relative to the transport opening 22 in the housing 21. A not-shown flow path of cooling water is formed in the cooling plate 24, so that the wafer W, which has been placed on the cooling plate 24 after the heating process, can be cooled. By moving the transport arm F5 (F6) up and down, the wafer W is transported between the cooling plate 24 and the transport arm F5 (F6).

A heating plate 25 for placing the wafer W thereon is disposed in a rear part of the housing 21. The reference numeral 26 indicates a heater that heats the heating plate 25. The wafer W is transported from the cooling plate 24 to the heating plate 25 heated at a predetermined temperature, so that the wafer W is subjected to a heating process. In this embodiment, the heating plate 25 serves as a second heating source. The reference numeral 27 depicts elevation pins that move up and down by an elevating mechanism 28 to transfer the wafer W between the heating plate 25 and the cooling plate 24 having been moved above the heating plate 25.

For example, a plurality of infrared lamps 34 that are infrared light irradiating units are disposed above the heating plate 25. Each infrared lamp 34 is configured to irradiate the wafer W with infrared light, i.e., light of wavelengths from 0.75 μm to 1 mm. The reference numeral 35 indicates a cover for covering a side periphery and an upper side of the infrared lamp 34. The inner surfaces of the cover 35 reflect the infrared light from the infrared lamp 34 to direct the infrared light downward. A filter 36 is disposed below the infrared lamps 34. The filter 36 is made by stacking a plate-like glass and a film of antimony-doped tin oxide, for example, so as to cover the entire wafer W placed on the heating plate 24. The filter 36 is configured to allow infrared light of wavelengths from 2.0 to 6.0 μm to pass therethrough, and to block infrared light of wavelengths out of the range from 2.0 to 6.0 μm. The reason for irradiating the wafer W with infrared light of wavelengths from 2.0 to 6.0 μm selectively is described later. The filter 36 and the infrared lamps 34 serve as a first heating source.

The coating and developing apparatus 1 is provided with a control unit 10 comprising a computer. The control unit 10 has a program storage part, not shown. A program that is a software having commands for performing a coating and developing process, which will be described below, is stored in the program storage part. When the program is read out by the control unit 10, the control unit 10 outputs control signals to the respective units of the coating and developing apparatus 1, so that the wafer W is subjected to a coating and developing process described below, by controlling operations of the respective transport arms, processes of the wafer in the respective modules, supply of the developer and the resist to the wafer W. The program is stored in the program storage part under the condition where the program is stored in a storage medium such as a hard disc, a compact disc, a magnet-optical disc or a memory card.

Figure 6:
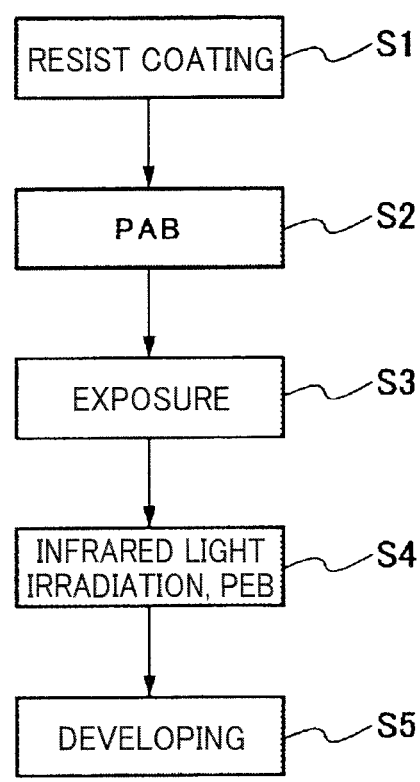
FIG. 6 is a flowchart of a process of a wafer in a first embodiment.

FIG. 6 is a flowchart schematically showing process steps of the wafer W by the system composed of the coating and developing apparatus 1 and the exposure apparatus D4. The transport route of the wafer W in the coating and developing apparatus 1 is explained with reference to FIG. 6, in addition to FIGS. 1 and 3. The wafer W is transported by the transfer mechanism 13 from the carrier C to the transition module TRS0 in the tower T1 in the process block D2.

The wafer W is transported from the transition module TRS0 to the unit block E1 or E2. For example, if the wafer W is delivered to the unit block E1, the wafer W is transferred from the transition module TRS0 to the transition module TRS1 (among the transition modules TRS of the tower T1) corresponding to the unit block E1, which is a transition module to which the wafer W can be transferred by the transport arm F1. On the other hand, if the wafer W is delivered to the unit block E2, the wafer W is transferred from the transition module TRS0 to the transition module TRS2 corresponding to the unit block E2. Each transferring operation of the wafer W is carried out by the transfer arm 15.

Each of the wafers W thus sorted is transferred to the transition module TRS1 (TRS2) is transported therefrom to the antireflection-film forming module, to the heating module 20 and to the transition module TRS1 (TRS2), in this order. Thereafter, the wafer W is transported by the transfer arm 15 to the transition module TRS3 corresponding to the unit block E3 or the transition module TRS4 corresponding to the unit block E4.

Each of the wafers W thus sorted to the transition module TRS3 and TRS4 is transported from the TRS3 (TRS4) to the resist coating module in which a resist is applied to the antireflection film so that a resist film is formed on the surface of the wafer W (in FIG. 6, step S1). After that, the wafer W is transported to the heating module 20, and is placed on the heating plate 25 of the heating module 20 so as to be subjected to a heating process (PAB process) (step S2). Thereafter, the wafer W is transported to the transition module TRS in the tower T2. The wafer W transported to the transition module TRS is loaded by the interface arms 16, 18 into the exposure apparatus D4 through the tower T3. Then, the resist film is exposed so that a latent image of a resist pattern is formed (step S3).

The exposed wafer W is transported by the interface arms 16, 17 between the towers T2 and T4, and is transported to the transition module TRS5 of the tower T2 corresponding to the unit block E5 or the transition module TRS6 of the tower T2 corresponding to the unit block E6. Thereafter, the wafer W is transported to the heating module 20, and is subjected to infrared light irradiation and a heating process (PEB process) (step S4). Details of the process in the step S4 are described below. After that, the wafer W is transported to the developing module 3 and is subjected to a developing process (step S5) so that a resist pattern is formed in the resist film. Then, the wafer W is heated in the heating module 20. Thereafter the wafer W is transported to the transition module TRS in the tower T1 so as to be returned to the carrier C through the transfer mechanism 13.

Figure 7:
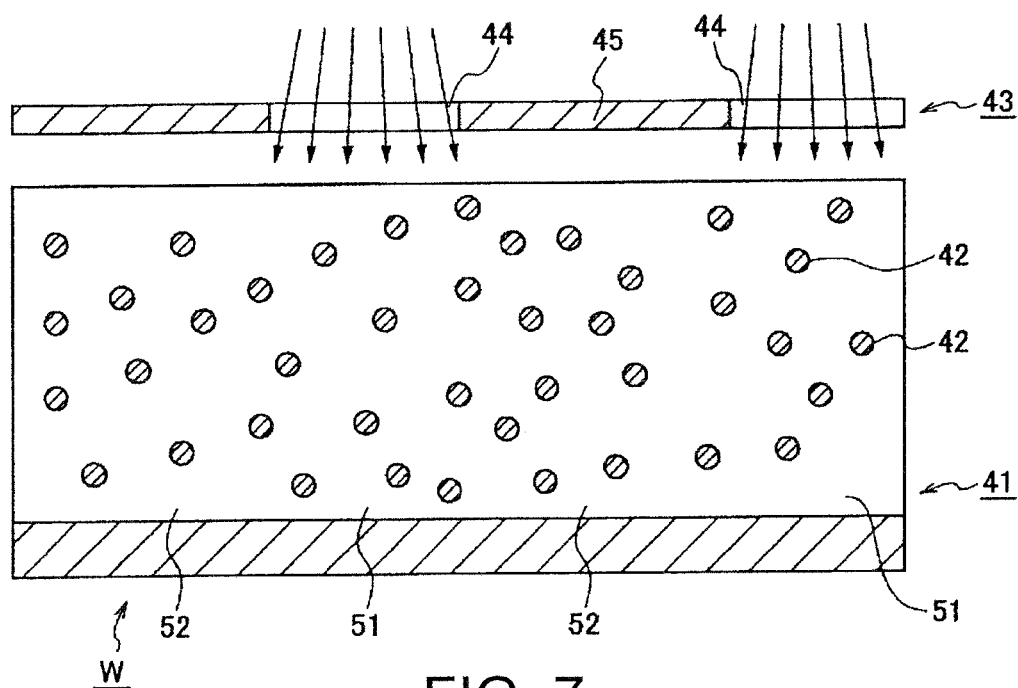
FIG. 7 is a schematic diagram showing a condition of a resist film.
Figure 8:
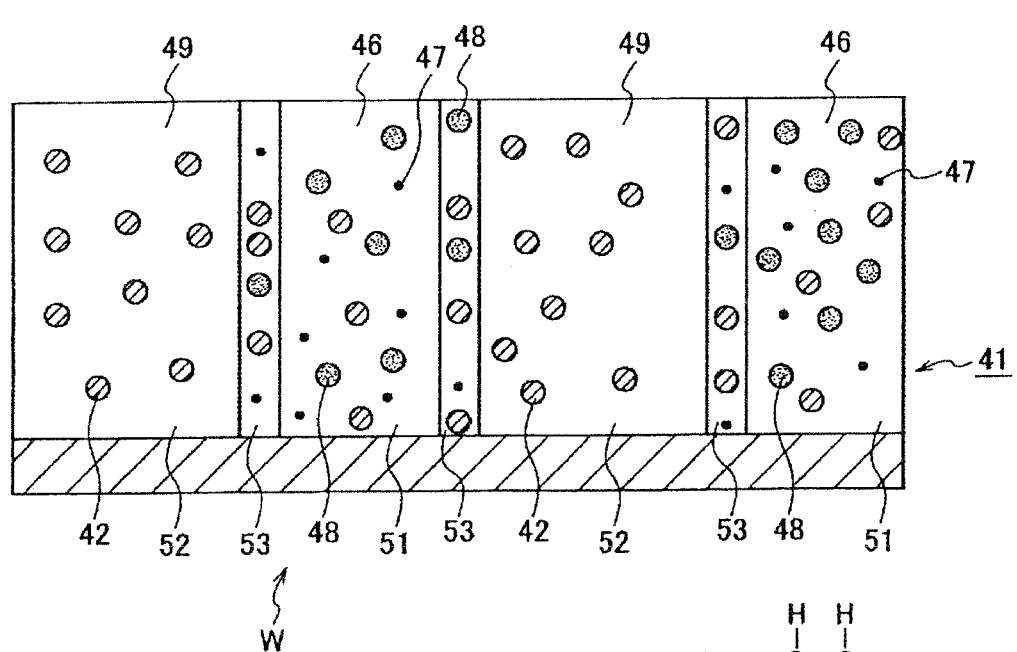
FIG. 8 is a schematic diagram showing a condition of the resist film.

Next, the change of the surface condition of the wafer W in the steps S3 to S5 is explained with reference to the schematic diagrams of FIGS. 7 to 12. FIG. 7 shows the wafer W that is exposed in the step S3. The reference numeral 41 indicates a resist film. The reference numeral 42 indicates resins insoluble in the developer contained in the resist film 41. The reference numeral 43 indicates a mask of the exposure apparatus D4. Apertures 44 are formed in the mask 43 according to a predetermined pattern. In FIG. 7, the part that blocks light in the mask 43 is shown as a shielding part 45.

In exposed areas 51 of the resist film 41 below the apertures 44, acids 47 are produced from an acid generator (not shown) contained in the resist film 41, by the light having been transmitted through the apertures 44 of the mask 43, so that the resins 42 are decomposed by the acids 47. To be specific, the resins 42 are altered such that protecting groups (shown as R in FIG. 7) that make the resins 42 insoluble in the developer are removed from the resin 42, and that the resins 42 have hydroxyl groups instead of the protecting groups. Due to the provision of the hydroxyl groups, the resins 42 become soluble in the developer. The resins 48 soluble in the developer are indicated by the reference numeral 48 in FIG. 8. In this manner, the latent image of the pattern is formed in the resist film 41.

In the resist film 41, each of the areas that is light-shielded by the shielding part 45 of the mask 43 is referred to as a light-shielded area (non-exposed area) 52. In the resist film 41 below the boundary between the aperture 44 and the shielding part 45 of the mask 43, there is formed an area 53 (referred to as "intermediate area" for convenience of explanation) which is less irradiated with light than the exposed area 51, because of the scattering of light. The proportion of the acids 47 and the resins 48 soluble in the developer in the area 53 is greater than that of the light-shielded area 52, and is less than the exposed area 51.

For the purpose of comparison with the altering of the resist film in this embodiment, an explanation is made for a case where the wafer W on which the exposed area 51, the light-shielded area 52 and the intermediate area 53 are formed is subjected to the PEB process and the developing process, but the wafer is not irradiated with infrared light unlike this embodiment.

Figure 13:
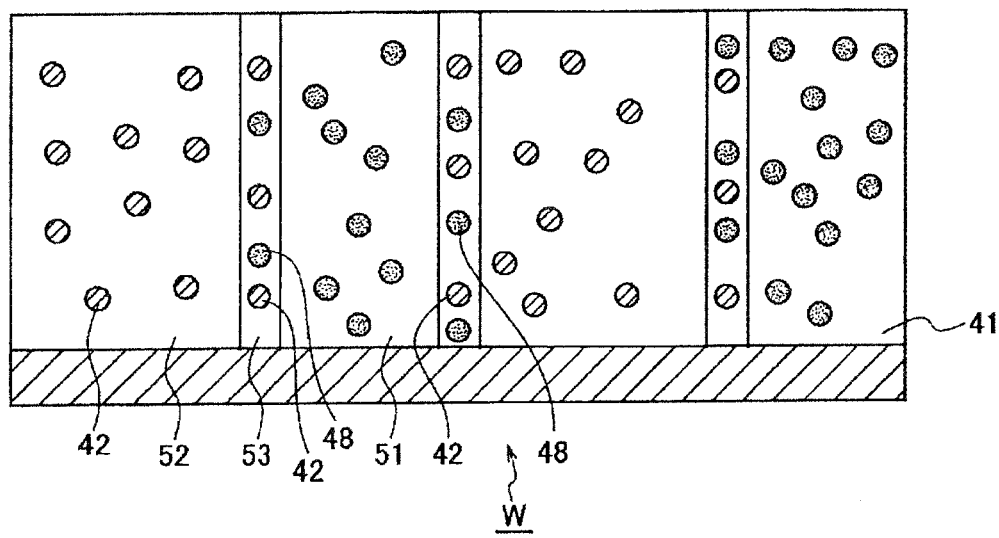
FIG. 13 is a schematic diagram showing a condition of a resist film in a case where the resist film is not irradiated with infrared light.
Figure 14:
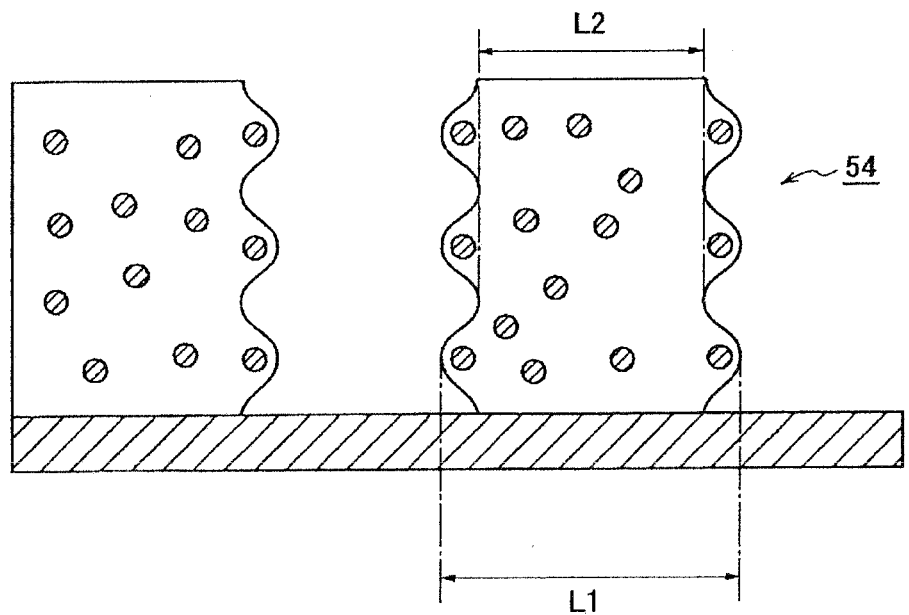
FIG. 14 is a schematic diagram showing a condition of the resist film in the case where the resist film is not irradiated with infrared light.

FIG. 13 is a schematic diagram of the wafer W that has been subjected to the PEB process. In the exposed area 51, a relatively great amount of acids 47 are produced before the PEB process, so that the resins 42 are altered into the resins 48. Thus, after the PEB process, the proportion of the resin 48 is high. However, in the intermediate area 53, since an amount of acids 47, which are produced before the PEB process, is relatively smaller, the resins 42 are less likely to be altered into the resins 48 as compared with the exposed area 51. Thus, after the PEB process, both the resins 42 and the resins 48 are likely to exist in the intermediate area 53. FIG. 14 shows the developed wafer W. As shown in FIG. 14, due to mixed existence of the resins 42 and 48, sidewalls of a resist pattern 54 have irregularities which make serious a roughness on the sidewalls of the resist pattern 54.

Figure 15:
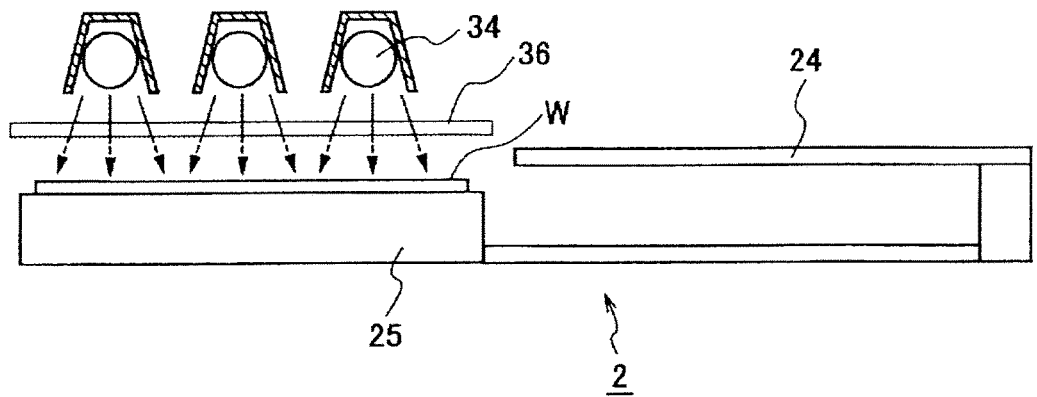
FIG. 15 is an operation chart of the heating module.

The explanation is now returned to the first embodiment. The exposed wafer W is loaded into the heating module 20 in order to perform the step S4. The wafer W is transported from the cooling plate 24 to the heating plate 25 heated at, e.g., 90° C. to 130° C. and is placed thereon. Simultaneously therewith, the wafer W is irradiated with infrared light from the infrared lamps 34, so that infrared light of wavelengths from 2.0 to 6.0 μm is supplied to the resist film 43 through the filter 36. FIG. 15 shows the heating module 2 that heats the wafer W and irradiates the wafer W with infrared light.

Figure 9:
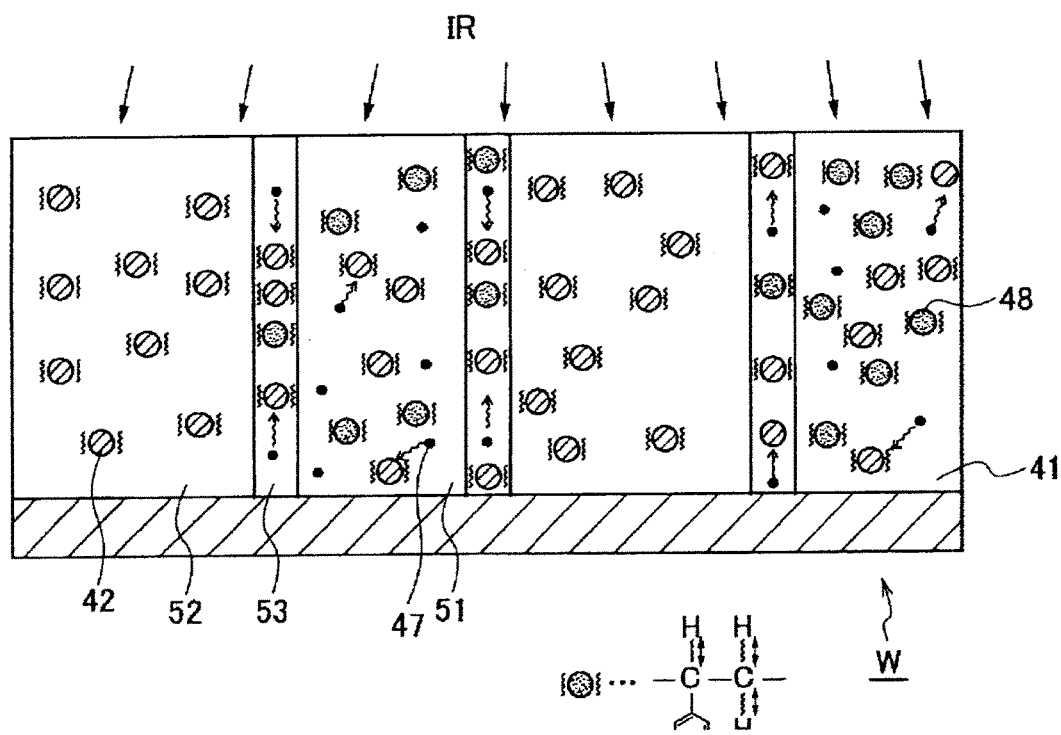
FIG. 9 is a schematic diagram showing a condition of the resist film.
Figure 10:
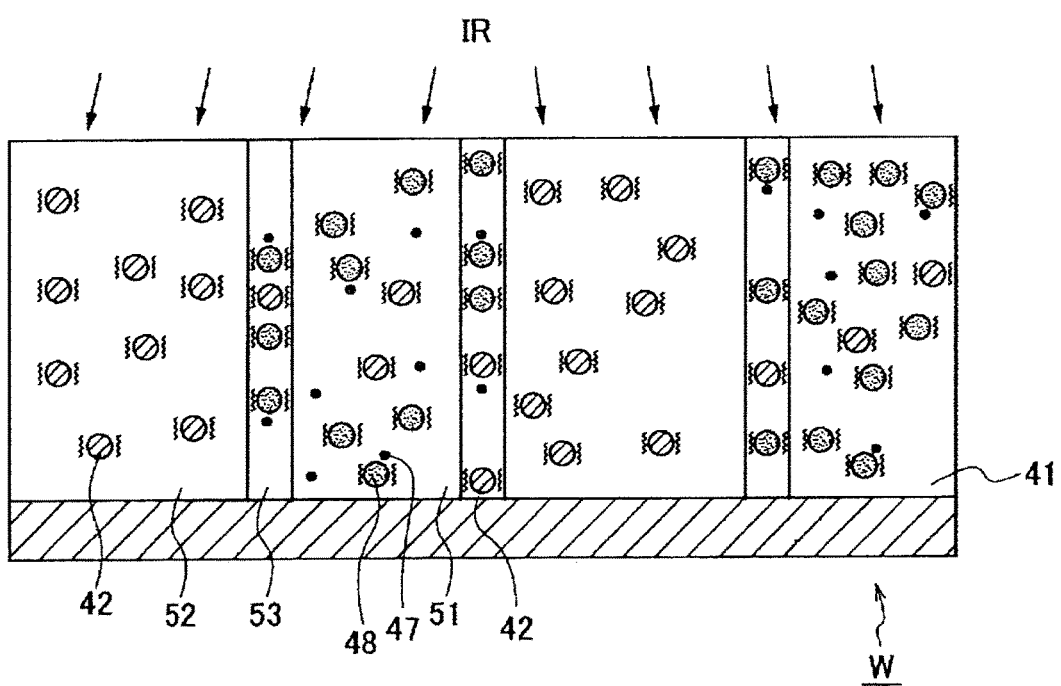
FIG. 10 is a schematic diagram showing a condition of the resist film.

Due to the infrared light (IR) of wavelengths from 2.0 to 6.0 μm, in the resins 42, stretching vibrations of a single bond formed between carbon and hydrogen are promoted. In the resins 48, the stretching vibrations of a single bond between carbon and hydrogen, and stretching vibrations of a bond between hydrogen and oxygen in the hydroxyl groups are promoted. Namely, molecules constituting the resins 42, 48 vibrate (FIG. 9). The inventor considers that, since the molecules vibrate, the acids 47 in the exposed area 51 and the intermediate area 53 flow in the resist film 41. The flowing acids 47 act on the resins 42, whereby the resins 42 are altered into the resins 48. Thus, the proportion of the resins 48 relative to the resins 42 increases in the exposed area 51 and the intermediate area 53 (FIG. 10).

Figure 11:
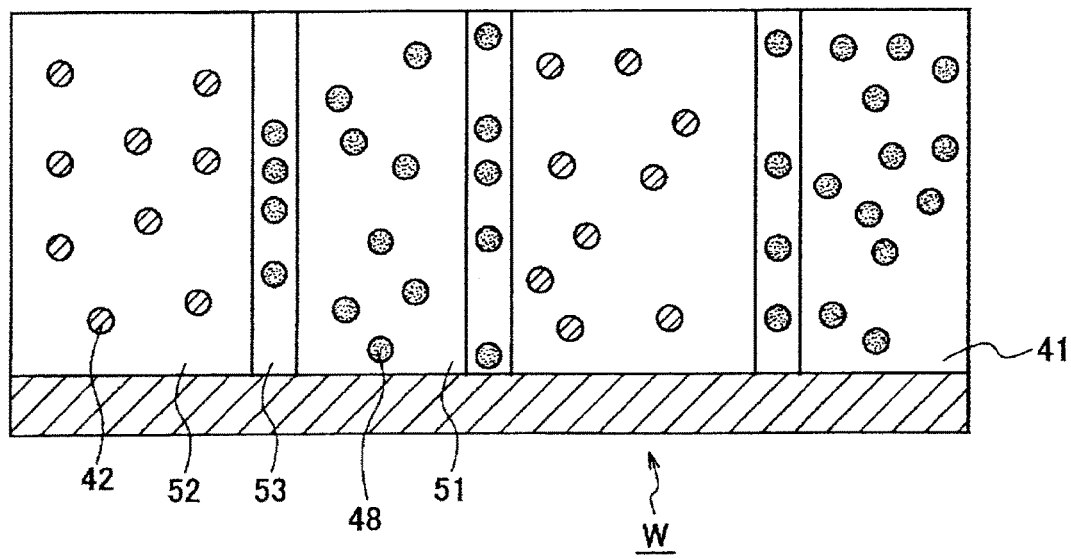
FIG. 11 is a schematic diagram showing a condition of the resist film.

The temperature of the wafer W gradually increases by the heating plate 25, so that the acids 47 are diffused in the resist film 41 by thermal energy from the heating plate 25. Namely, the PEB process is performed. Owing to this, the altering from the resins 42 into the resins 48 in the exposed area 51 and the intermediate area 53 further progresses. With further increase of the temperature of the wafer W, the acids 47 volatilize to be removed from the resist film 41. After the wafer W has been placed on the heating plate 25 for a predetermined period of time, the infrared light irradiation is stopped, and the wafer W is unloaded from the heating module 2. FIG. 11 shows the wafer W unloaded from the heating module 2 after the PEB process.

The reason for selecting, by using the filter 36, the wavelengths of infrared light with which the wafer W is irradiated is to cause the altering from the resins 42 into the resins 48 while suppressing increase of the temperature of the resist film 41 by the infrared light. That is, if the wavelength range of infrared light with which the wafer W is irradiated is wide, the infrared light is likely to include infrared light of wavelengths that can be absorbed by silicon constituting the resist film 41 and the wafer W. Thus, the temperature of the wafer W abruptly increases. The abrupt increase of the temperature of the wafer W results in volatilization of the acids 47 before the acids 47 sufficiently flow through the resist film 41 so that the altering into the resins 48 occurs insufficiently. In order to prevent this, the wavelengths are selected as mentioned above.

Figure 12:
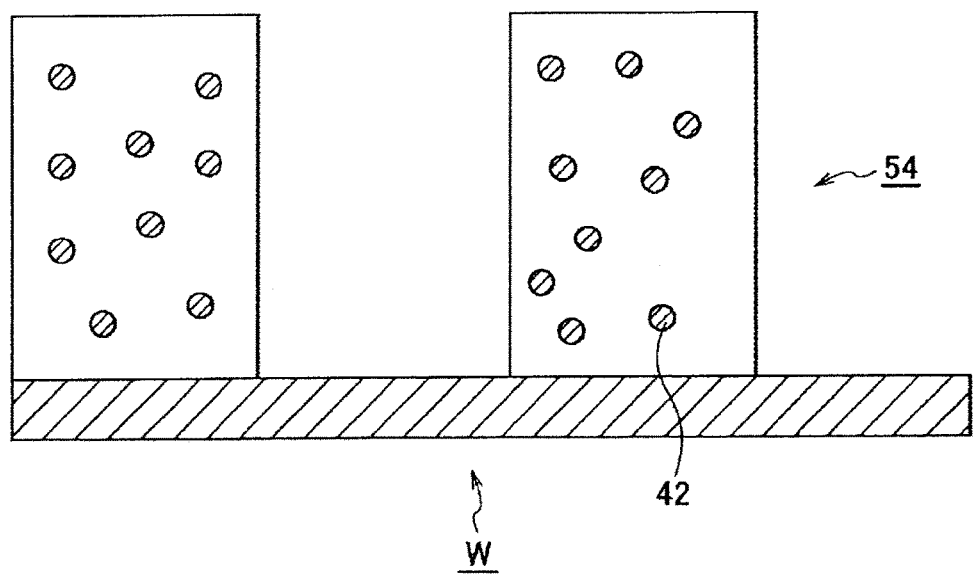
FIG. 12 is a schematic diagram showing a condition of the resist film.

Due to the flowing movement of the acids 47 which is caused by the irradiation of infrared light, the coexistence of the resins 42 and 48 is prevented in the intermediate area 53, after the PEB process. Thus, in the developing process in the step S5, the entire intermediate area 53 is dissolved by the developer. Thus, formation of irregularities on the sidewalls of the resist pattern 54 from the intermediate area 53 can be prevented. As a result, as shown in FIG. 12, roughening of the sidewalls of the resist pattern 54 can be suppressed.

According to the coating and developing apparatus 1, since the PEB process is performed by irradiating the exposed resist film with infrared light of selected wavelengths that vibrates molecules constituting the resist film, the degree of roughness of the sidewalls of the resist pattern 54 can be suppressed, as shown in the below evaluating experiments. In addition, because of the flowing movement of the acids 47 in the exposed area 51 which is caused by the infrared light irradiation as described above, the resins in the resist film 41 in the exposed area 51 process can be made soluble in the developer after the PEB, even if the amount of acids 47 produced by the exposure in the exposure apparatus D4 is small. Namely, even if the intensity of light to be supplied to the wafer W in the exposure apparatus D4 is decreased, the resist pattern 54 can be resolved. As described above, in a case where the wafer W is exposed by using EUV of wavelengths from 10 nm to 15 nm, since it is difficult to supply the wafer W with light of a high intensity, the use of the present method is effective. As the exposure apparatus D4, an exposure apparatus having KrF or ArF as a light source may be used.

Figure 16:
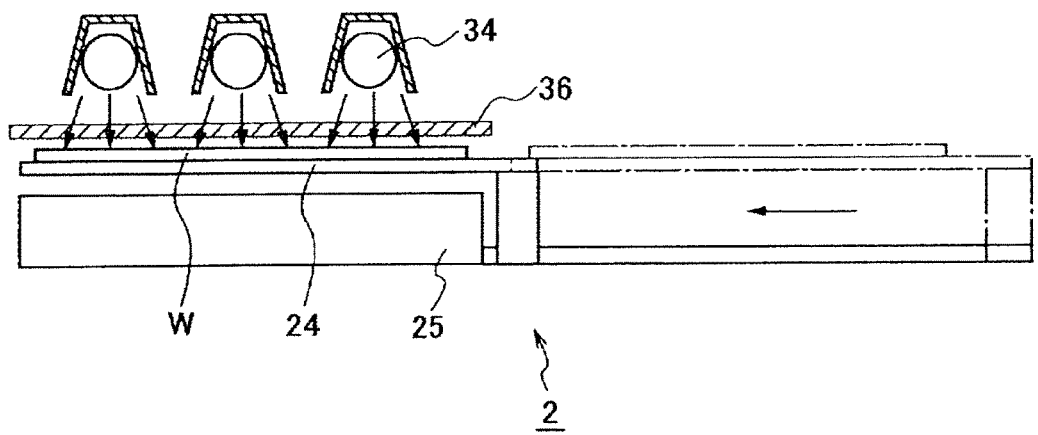
FIG. 16 is an operation chart of the heating module.

In addition, in the above embodiment, the wafer W is irradiated with infrared light, while the wafer W is being placed on the heating plate 25 so that the temperature of the wafer is rising, in order to improve the throughput. However, as shown in FIG. 16, the wafer W placed on the cooling plate 24 positioned below the filter 36 may be irradiated with infrared light, and thereafter the wafer W may be placed on the heating plate 25 so as to be subjected to the PEB process. In this case, the wafer W may be continuously irradiated with infrared light after the transfer of the wafer W to the heating plate 25, or alternatively, the infrared light irradiation may be stopped after the transfer of the wafer W to the heating plate 25. Also in this case, the infrared light irradiation is started from the time when the cooling plate 24 is located on the front side of the module 2 remote from the heating plate 25 as shown by the chain lines until the time when the cooling plate 24 is located above the heating plate 25 as shown by the solid lines. Namely, the wafer W may be irradiated with infrared light while the wafer W is being transported to the heating plate 25 by the cooling plate 24 that is a moving part.

Figure 17:
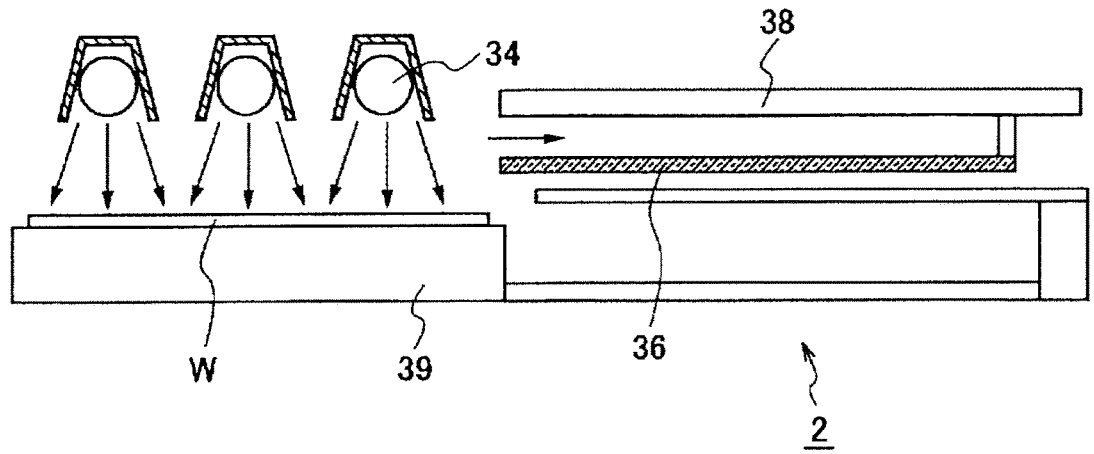
FIG. 17 is an operation chart of the heating module.

As shown in FIG. 17, in the heating module 2, there may be provided a drive unit 38 that moves the filter 36 toward the front side in the housing 21. In this case, instead of the heating plate 25, for example, a stage 39 that does not have the heater 26 is provided. The wafer W placed on the stage 39 is irradiated with infrared light through the filter 36 located above the stage 39 so as to cause acids to flow. Thereafter, as shown in FIG. 17, the filter 36 is retracted from above the stage 39, and the PEB process may be performed by irradiating the wafer W with infrared light of wavelengths wider than 2.0 μm to 6.0 μm. The filter 36, which is located on a position removed from a light path extending from the infrared lamps 34 toward the wafer W, and the infrared lamps 34 serve as the second heating source. Instead of the filter 36, the stage 39 and the infrared lamps 34 may be configured to be movable so that the PEB process can be performed after flowing of the acids.

Second Embodiment

In the second embodiment, the same coating and developing apparatus 1 as that used in the first embodiment is used, but heating modules disposed in the unit blocks E3 and E4 are the aforementioned heating modules 2. The heating modules disposed in the unit blocks E3 and E4 are the heating modules 20 that are not equipped with the above filter 36 and the infrared lamps 34.

Figure 18:
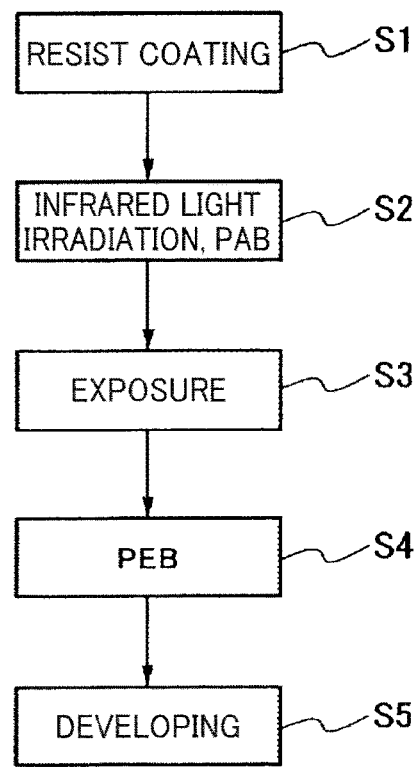
FIG. 18 is a flowchart of a process of a wafer in a second embodiment.

FIG. 18 is a flowchart for the second embodiment. As shown in FIG. 18, the second embodiment differs from the first embodiment in step S2 in which the wafer W is irradiated with infrared light when the PEB process is performed. To be specific, as shown in FIG. 15, the wafer W is placed on the heated heating plate 25, and the wafer W placed on the heating plate 25 is irradiated with the infrared light of wavelengths from 2.0 μm to 6.0 μm, through the filter 36. Namely, the infrared light irradiation is performed while the wafer W is placed on and is being heated by the heating plate 25 so that the solvent in the resist film is removed. In addition, in this embodiment, the infrared light irradiation is not performed in step S4.

Figure 19:
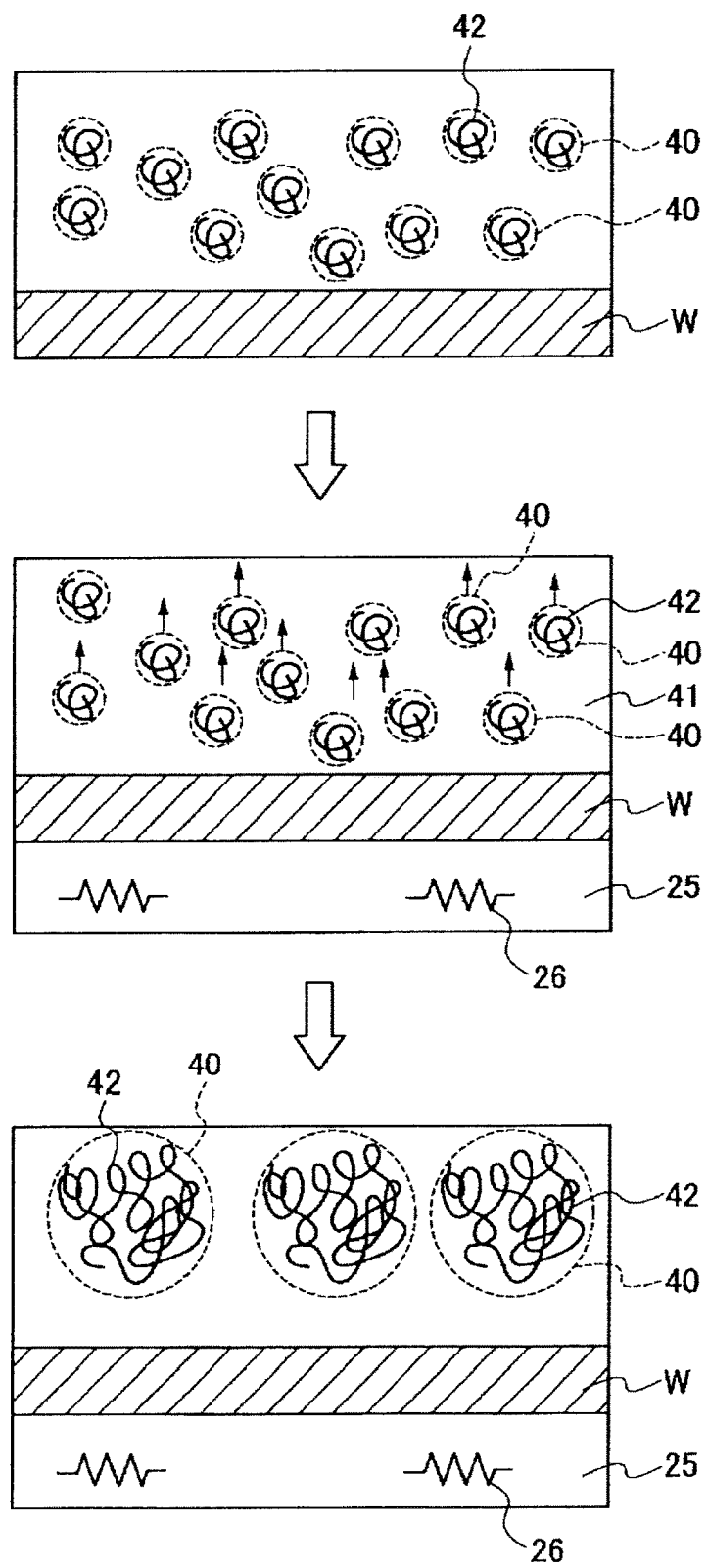
FIG. 19 is a schematic diagram showing a condition of a resist film in a case where the resist film is not irradiated with infrared light.

In order to explain the reason for irradiating the wafer W with the infrared light of the aforementioned wavelengths simultaneously with performing the PAB process, there is explained as a comparative example, a resist film 41 which is subjected to the PAB process which is performed without the wafer being irradiated with infrared light, with reference to a schematic diagram of FIG. 19. In FIG. 19, resins 42 in the resist film 41 are indicated by symbols having a shape different from those shown in FIGS. 7 to 12, for convenience of explanation. The upper row of FIG. 19 shows the resist film 41 before being subjected to the PAB process. Resist particles composed of aggregated resins 42 in the resist film 41 are shown by reference numeral 40. Before the PAB process, the particles 40 are dispersed in the resist film 41 with relatively high uniformity.

The middle row of FIG. 19 shows the situation where the wafer W placed on the heating plate 25 is being subjected to the PAB process. Since the wafer W is heated by the heating plate 25 from below, a temperature gradient is formed in the resist film 41. During the PAB process, since flowability of the particles 40 is relatively high because the solvent remains in the resist film 41, the particles 40 flow according to the temperature gradient. It is considered that the particles 40 aggregate during their flowing movement so that the particle diameter of each particle 40 increases as shown in the lower row in FIG. 19.

Figure 20:
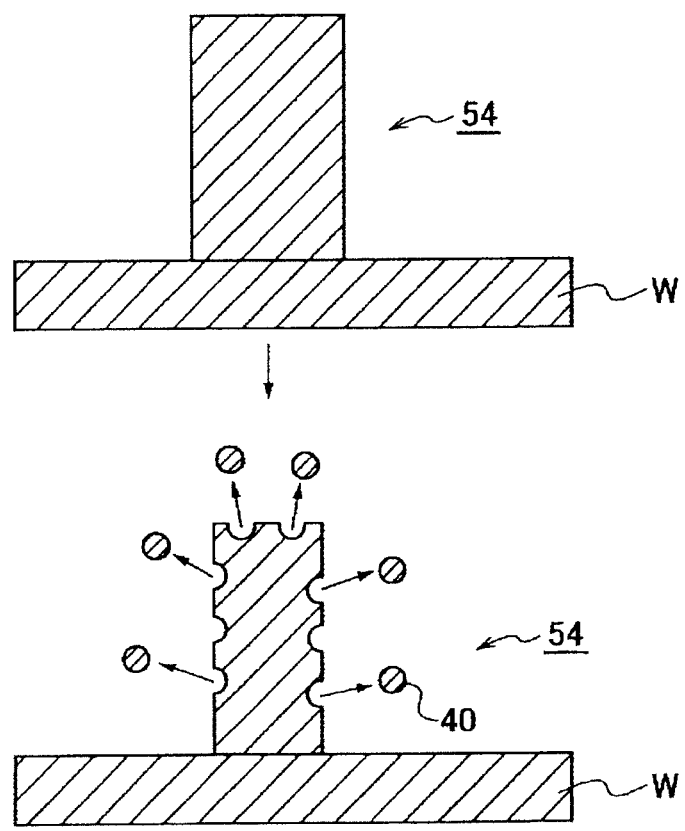
FIG. 20 is a schematic diagram of a resist pattern in a case where the resist film is not irradiated with infrared light.

The upper row of FIG. 20 show a resist pattern 54 having a target shape. Although the target shape of the resist pattern is a rectangular shape in side view, an upper surface and side surfaces thereof are actually etched by the developer flowing along the surface of the wafer W and a cleaning liquid supplied for sweeping the developer away from the wafer W after the supply of the developer. At this time, since the diameter of the particle 40 is large as described above, the diameter of the particle 40, which is etched to be removed from the resist pattern 54 as shown in the lower row of FIG. 20, is large. As a result, it is considered that roughness of the sidewalls of the resist pattern 54 becomes large. In addition, since the diameter of the particle 40 desorbing from the upper part of the resist pattern 54 is large, the difference between the height of the resist pattern 54 and the film thickness of the resist film 41 when the PAB process is completed is large.

Figure 21:
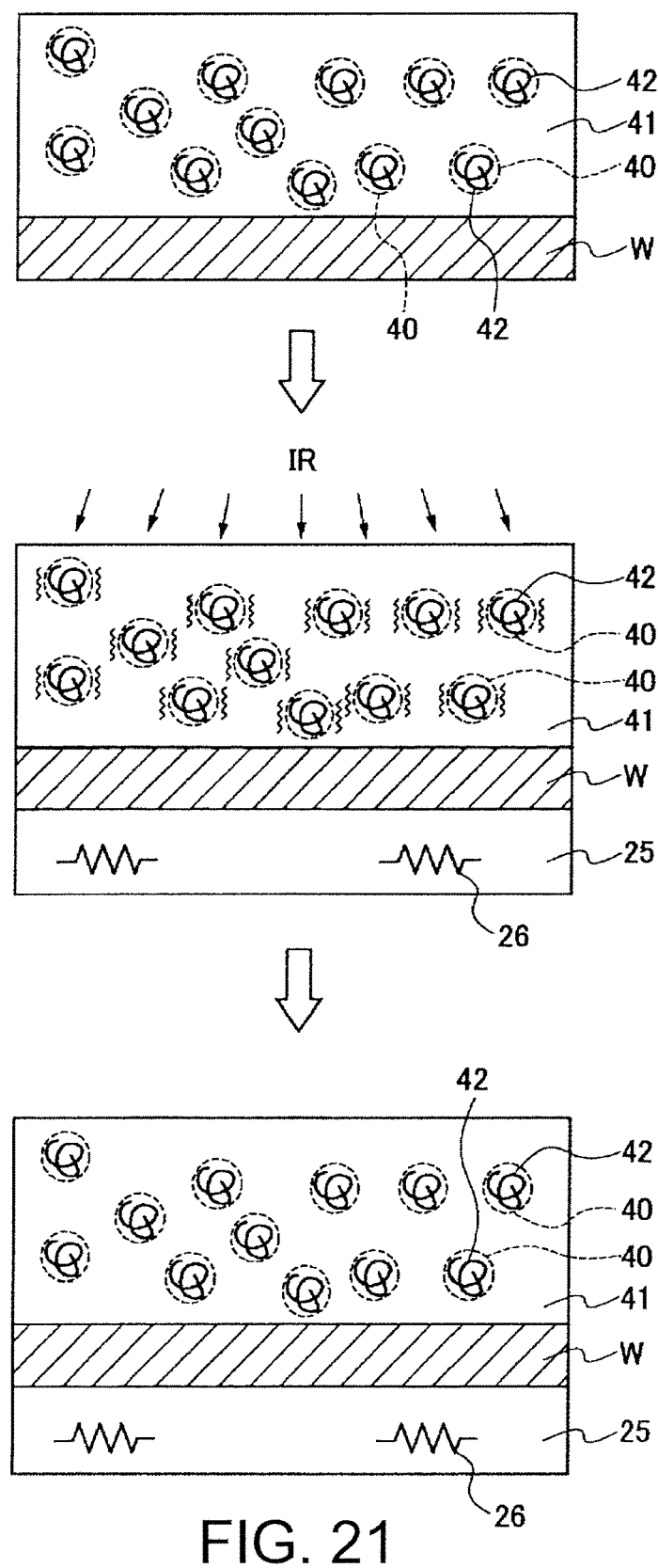
FIG. 21 is a schematic diagram showing a condition of a resist film.

The explanation is now returned to the second embodiment. The upper row of FIG. 21 shows the wafer W before being subjected to the PAB process, similarly to the upper row of FIG. 19. As described above, the resist particles 40 are dispersed in the resist film 41 highly uniformly. The middle row of FIG. 22 shows the situation where the wafer W placed on the heating plate 25 is irradiated with infrared light of wavelengths from 2.0 to 6.0 µm, while the wafer W being subjected to the PAB process, similar to the step S2 of the flowchart in FIG. 18 described above.

The infrared light is absorbed in the resins 42, and stretching vibrations of bonds between atoms of the resins 42 are promoted, as described in the first embodiment. The infrared light enters from the surface layer of the resist film 41 into the deep part of the resist film 41, so that the resins 42 vibrate in the entire resist film 41, due to which the resist film 41 generates heat. The inventors consider that the generated heat suppresses the temperature gradient in the resist film 41 caused by the heating plate 25, whereby the flowing movement of the particles 40 is suppressed. As a result, as shown in the lower row of FIG. 21, the particles 40 are dispersed in the resist film 41 highly uniformly even after the PAB process, whereby the aggregation is suppressed.

Figure 22:
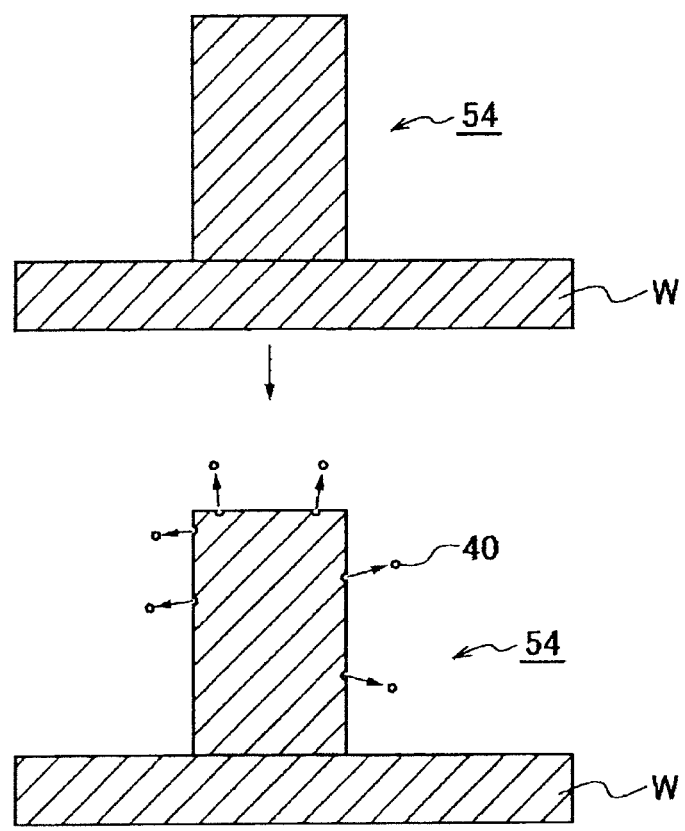
FIG. 22 is a schematic diagram of a resist pattern.
Figure 23:
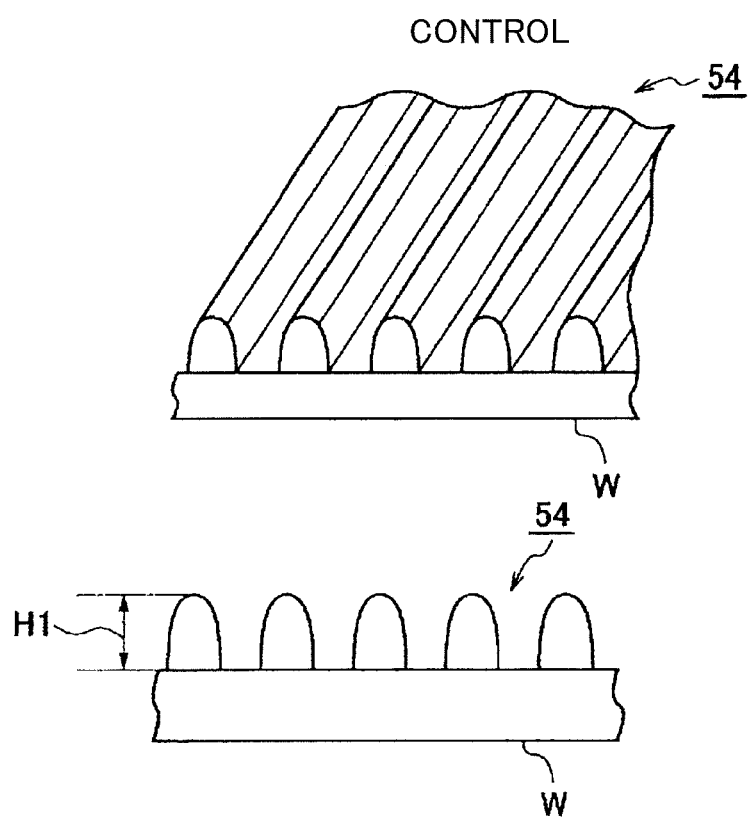
FIG. 23 is a schematic diagram of a resist pattern that was formed in a control experiment.
Figure 24:
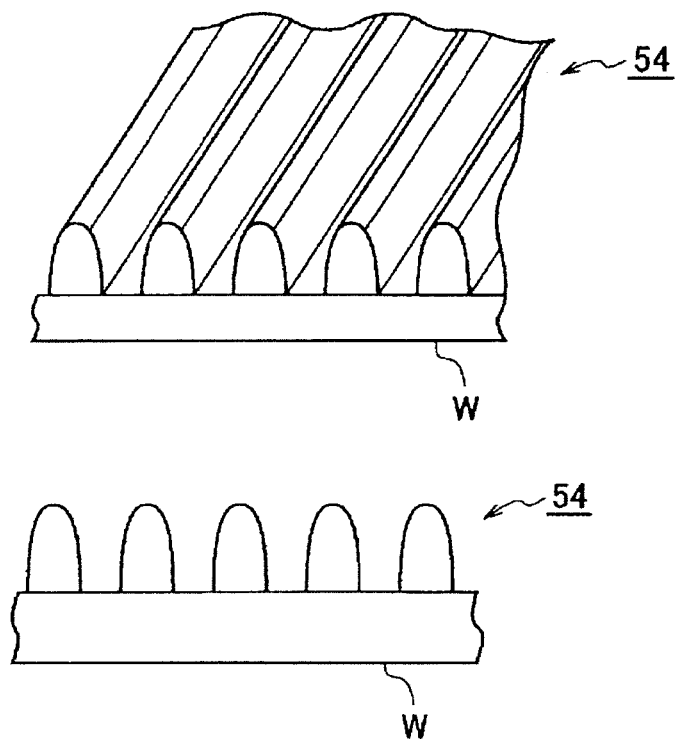
FIG. 24 is a schematic diagram of a resist pattern that was formed in an evaluating experiment.
Figure 25:
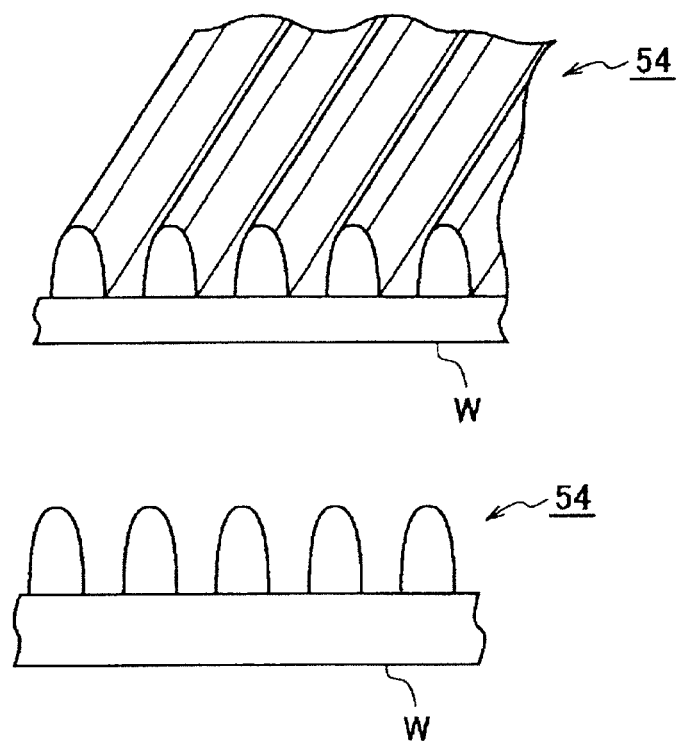
FIG. 25 is a schematic diagram of a resist pattern that was formed in an evaluating experiment.
Figure 26:
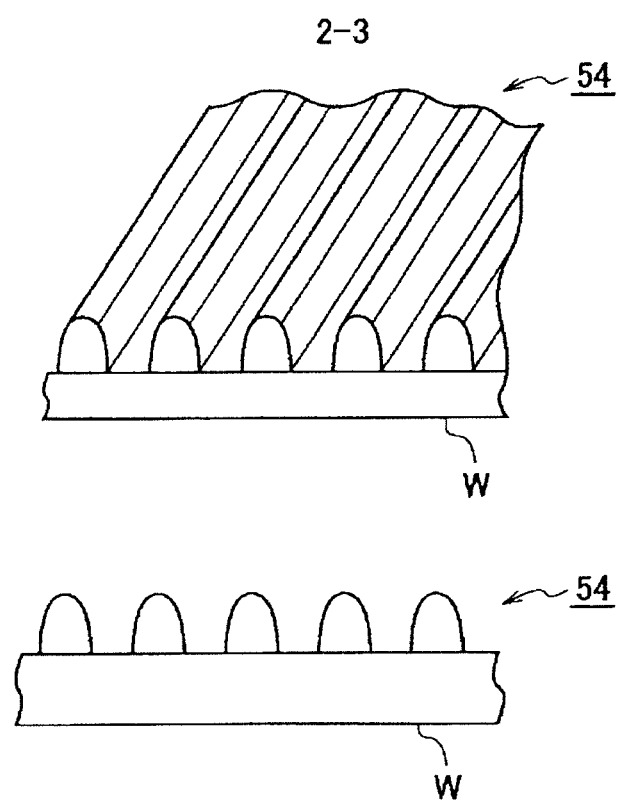
FIG. 26 is a schematic diagram of a resist pattern that was formed in an evaluating experiment.

Thus, as shown in FIG. 22, when the resist pattern 54 is scraped by the developer and the cleaning liquid, the diameter of the particles 40, scraped and removed from the resist pattern 54, is small. Thus, increasing of the roughness of the sidewalls of the resist pattern can be suppressed. In addition, it is possible to suppress the situation where the height of the resist pattern 54 is small relative to the film thickness of the resist film 41 after the PAB process.

The above-described first embodiment and the second embodiment may be combined with each other. Namely, when the wafer W is subjected to the PAB process, the wafer W may be irradiated with the infrared light of the aforementioned wavelengths. Further, after exposure of the wafer W, the wafer W may be irradiated with infrared light of the aforementioned wavelengths and then subjected to the PEB process. The heating module 2 is not limited to the aforementioned type that heats a wafer W by the heating plate 25 having the heater 26. For example, the heating module 2 has LEDs that emit lights to the the rear surface of a wafer W. These LEDs may irradiate the wafer W with light of wavelengths to be absorbed by silicon constituting the wafer W, so as to heat the wafer W.

Although the embodiments in which a positive resist is used are described, a negative resist may be used. The application of the second embodiment is not limited to the case where a chemically amplified resist is used, because the second embodiment suppresses the roughness of a pattern by suppressing aggregation of particles as described above. Namely, a resist not containing acid generator may be used. In addition, in the first embodiment, although the module for performing the infrared light irradiation and the module for performing the PEB process are integrated into one heating module 2 for saving space, the module for performing the infrared light irradiation and the module for performing the PEB process may be provided separately. To be specific, one of the modules of the shelf unit U of the unit blocks E5 and E6 may be structured as an infrared light irradiating module having the above-described stage 39, the filter 36 and the infrared lamps 34. In this case, after the wafer W has been irradiated with infrared light by the infrared module, the wafer W may be transported to the heating module 20 of the shelf unit U to perform the PEB process to the wafer W.

Evaluating Experiments (Evaluating Experiment 1)

A plurality of the wafers W were processed in accordance with the aforementioned procedure described in connection with the first embodiment. Wafers W were processed with different dose amounts ($mJ/cm^2$) (the dose amount means an amount of energy of the exposure beam of the exposure apparatus D4). The CD (nm) which is the line width of the resist pattern, and LWR (Line Width Roughness) (nm) which is the index of the roughness of the sidewalls of the resist pattern, were measured for each wafer W. The dose amount was changed stepwise at 1 $mJ/cm^2$ intervals. Evaluating experiments with the dose amount of 20.5 $mJ/cm^2$, 19.5 $mJ/cm^2$, 18.5 $mJ/cm^2$, 17.5 $mJ/cm^2$ and 16.5 $mJ/cm^2$ are referred to as Experiment 1-1, 1-2, 1-3, 1-4 and 1-5, respectively. The LWR is a value obtained by the maximum value minus minimum value of the line width of the resist pattern 54. If the resist pattern 54 is formed as shown in FIG. 14, the LWR is the difference between L1 and L2 in FIG. 14. The smaller the LWR is, the smaller the roughness of the sidewalls of the resist pattern 54 is (it is preferable).

In Evaluating Experiment 1, the infrared light irradiation of the aforementioned wavelengths and the PEB process were performed by different modules. When irradiating the infrared light, the wafer W was placed on the cooling plate, and the temperature thereof was regulated at 35° C. The PEB process was performed by placing the wafer W on the heating plate 25. When the wafer W was being placed on the heating plate 25, the wafer W was not irradiated with infrared light. As a control experiment, the same processes as those of Evaluating Experiments 1-1 to 1-5 were performed excluding that the infrared light irradiation was not performed, and the CD and the LWR were measured. In the control experiment, the dose amount was set at 21.5 $mJ/cm^2$.

Table 1 below shows the result of Evaluating Experiment 1. As shown in Table 1, it was confirmed that, in Evaluating Experiments 1-1 to 1-5, although each of the dose amounts was smaller than the dose amount in the control experiment, the LWR and the CD were substantially the same or smaller than those of the control experiment. In addition, in Evaluating Experiments 1-1 to 1-5, it was confirmed that, the larger the dose amount was, the smaller the CD was. Thus, from the result of Evaluating Experiment 1, it was confirmed that the process in accordance with the first embodiment could suppress the roughness of the resist pattern 4, and that exposure energy, which was emitted by the exposure apparatus D4 for obtaining a predetermined CD of the line width, could be suppressed.

TABLE 1

|  | Control Experiment | Evaluating Experiment 1-1 | Evaluating Experiment 1-2 | Evaluating Experiment 1-3 | Evaluating Experiment 1-4 | Evaluating Experiment 1-5 |
| --- | --- | --- | --- | --- | --- | --- |
| Dose Amount ($mJ/cm^2$) | 21.5 | 20.5 | 19.5 | 18.5 | 17.5 | 16.5 |

TABLE 1-continued

|  | Control Experiment | Evaluating Experiment 1-1 | Evaluating Experiment 1-2 | Evaluating Experiment 1-3 | Evaluating Experiment 1-4 | Evaluating Experiment 1-5 |
|---|---|---|---|---|---|---|
| CD (nm) | 47.1 | 45.0 | 46.9 | 46.4 | 47.0 | 48.5 |
| LWR (nm) | 2.7 | 2.4 | 2.4 | 2.8 | 2.7 | 2.5 |

(Evaluating Experiment 2)

Next, in Evaluating Experiment 2-1, a process according to the same procedure as that of the above-described second embodiment was performed. Namely, a resist pattern 54 was formed on a wafer W under the condition that the wafer W was irradiated with infrared light when the PAB process was performed to the wafer W but thereafter the wafer W was not subjected to any infrared light irradiation. In Evaluating Experiment 2-2, a resist pattern 54 was formed on a wafer W under the condition that the PAB process was performed according to the same procedure as that of Evaluating Experiment 2-1, and after exposure, the PEB process was performed by heating the wafer W, while irradiating the wafer W with infrared light, similarly to the first embodiment. In Evaluating Experiment 2-3, a resist pattern 54 was formed on a wafer W under the condition that, similarly to Evaluating Experiment 1, the wafer W placed on the cooling plate 25 was irradiated with infrared light, and thereafter the wafer W was placed on the heating plate 25 to perform the PEB process. In Evaluating Experiment 2-3, the infrared light irradiation was not performed during the PAB process. In Evaluating Experiment 2-3, the infrared light irradiation was performed for a longer time (in detail, three minutes) than that in Evaluating Experiment 2-2. The cross sections of the resist patterns 54 formed in Evaluating Experiments 2-1 to 2-3 were observed and their heights were measured. As a control experiment, a resist pattern 54 was formed under the condition that infrared light irradiation was not performed during the period from the application of the resist to the execution of the PEB process. In the control experiment, the cross section of the resist pattern 54 was observed and its height was measured, similarly to Evaluating Experiments 2-1 to 2-3.

FIGS. 23 to 26 show the resist patterns 54 obtained in the control experiment and Evaluating Experiments 2-1 to 2-3. Each drawing shows, in its upper part a schematic diagram of the resist pattern 54 seen from above, and in its lower part a schematic diagram of the cross section of the resist pattern 54. Height H1 of the resist pattern 54 was 60 nm in the control experiment, 80 nm in Evaluating Experiment 2-1 and Evaluating Experiment 2-2, and 50 nm in Evaluating Experiment 2-3. The reason why the height of the resist pattern 54 in Evaluating Experiments 2-1 and 2-2 was larger than that of the control experiment is considered that uneven distribution and aggregation of the particles 40 in the resist film 41 were prevented by the infrared light irradiated in the PAB process, as described in connection with the second embodiment. The reason why the height of the resist pattern in Evaluating Experiment 2-3 was smaller than that of the control experiment is considered that acids flowed excessively because of the long infrared light irradiation time.

(Evaluating Experiment 3)

In Evaluating Experiment 3, a resist pattern was formed on each wafer by executing a process according to the first embodiment, while the wafer W, which was being heated to be subjected to the PEB process, was irradiated with infrared light. The infrared light irradiation time of the respective wafers W was changed within a range from 40 seconds to 80 seconds. In Evaluating Experiment 3, an apparatus having an ArF light source was used as the exposure apparatus D4, and was set such that a pattern of 45 nm was formed in the resist. As a control experiment, a resist pattern was formed in a wafer W under the condition that the wafer W was processed without being irradiated with infrared light after exposure. The time period in which the wafer W was placed on the heating plate 25 in the PEB process was 60 seconds. In Evaluating Experiment 3 and the control experiment, the LWRs of the resist patterns in various positions on the wafers W were measured. In addition, the average of the measured LWRs was calculated.

Table 2 below shows the result of Evaluating Experiment 3. In cases where the infrared light irradiation time were 60 seconds, 70 seconds and 80 seconds, the average value of the LWRs is smaller than the LWR in the control experiment. Thus, Evaluating Experiment 3 showed that the LWR, i.e., the roughness of the resist pattern 54 could be reduced by the method according to the aforementioned first embodiment.

TABLE 2

|  | Control Experiment | Evaluating Experiment 3 | | | | |
|---|---|---|---|---|---|---|
| Process Time (second) | 60 | 40 | 50 | 60 | 70 | 80 |
| LWR (nm) | 3.2 | 4.8 | 3.8 | 2.2 | 2.9 | 2.9 |
|  | 3.2 | 4.3 | 3.9 | 2.0 | 2.8 | 3.4 |
|  | 3.2 | 4.2 | 3.8 | 2.1 | 2.8 | 3.2 |
|  | 3.2 | 4.8 | 3.7 | 2.7 | 2.9 | 3.4 |
|  | 3.2 | 3.9 | 3.8 | 2.5 | 2.4 | 3.2 |
|  | 3.1 | 4.0 | 3.4 | 2.7 | 3.0 | 3.2 |
|  | 3.2 | 4.1 | 3.1 | 2.8 | 3.2 | 3.4 |
|  | 3.1 | 4.0 | 3.1 | 2.8 | 3.0 | 3.4 |
|  | 3.2 | 3.8 | 3.1 | 2.9 | 2.7 | 2.8 |
|  | 3.2 | 3.9 | 2.7 | 3.1 | 2.6 | 2.7 |
| Average Value (nm) | 3.17 | 4.17 | 3.44 | 2.57 | 2.83 | 3.14 |

(Evaluating Experiment 4)

In Evaluating Experiment 4, a resist pattern 54 is formed on each wafer W by executing a process according to the second embodiment. Namely, the wafer W was irradiated with infrared light of wavelengths from 2.0 to 6.0 μm, when the PAB process was performed. The wafer W was not irradiated with the infrared light after exposure. In Evaluating Experiment 4, the infrared light irradiation time of the respective wafers W was changed within a range from 50 seconds to 70 seconds. As a control experiment, a resist pattern was formed on a wafer W in the same manner as that of Evaluating Experiment 4, excluding that the wafer W was not irradiated with the infrared light when the PAB process was performed. Namely, in the control experiment, the wafer W was not irradiated with the infrared light during the period from the application of the resist to the execution of the PEB process. In the control experiment, the heating time of the wafer W was 60 seconds. The CD and the LWR of the resist patterns of the wafers W in Evaluating Experiments 4-1 to 4-3 and the control experiment were measured.

Table 3 below shows the result of Evaluating Experiment 4. In the case where the infrared light irradiation time was 50 seconds, the average value of LWRs was larger than the control experiment. On the other hand, in the cases where the infrared light irradiation time was 60 seconds and 70 seconds, the average value of LWRs was smaller than the control experiment. Thus, the result of Evaluating Experiment 4 showed that the use of the method of the aforementioned second embodiment could improve the LWR. In addition, in Evaluating Experiment 4, it was confirmed that the longer the infrared light irradiation time was, the smaller the CD was.

TABLE 3

|  | Control Experiment | Evaluating Experiment 4 | | |
|---|---|---|---|---|
| Process Time (second) | 60 | 50 | 60 | 70 |
| CD (nm) | 42.3 | 55.5 | 50.6 | 44.2 |
| LWR (nm) | 2.8 | 3.2 | 2.6 | 2.5 |
|  | 2.6 | 3.5 | 2.8 | 3.0 |
|  | 2.9 | 3.4 | 2.9 | 2.7 |
|  | 2.7 | 3.2 | 2.3 | 2.4 |
|  | 2.8 | 3.2 | 2.4 | 2.7 |
|  | 2.8 | 3.3 | 2.2 | 2.5 |
|  | 3.0 | 3.2 | 2.8 | 2.6 |
|  | 3.0 | 3.5 | 2.6 | 2.5 |
|  | 3.0 | 3.5 | 2.7 | 2.4 |
|  | 3.1 | 3.3 | 2.3 | 2.7 |
| Average Value (nm) | 2.87 | 3.27 | 2.55 | 2.59 |

(Evaluating Experiment 5)

In Evaluating Experiment 5, a process was performed according to substantially the same procedure as that of Evaluating Experiment 4. Evaluating Experiment 5 differed from Evaluating Experiment 4 in that a wafer was irradiated with infrared light of the wavelengths of the aforementioned range when the PEB process was performed, similarly to the first embodiment. The infrared light irradiation time in the PEB process was set at 60 seconds. The infrared light irradiation time during the PAB process was changed for each wafer, similarly to Evaluating Experiment 4. Similarly to Evaluating Experiment 4, the infrared light irradiation time of the respective wafers W was changed within a range from 50 seconds to 70 seconds.

Table 4 below shows the result of Evaluating Experiment 5. Table 4 also shows the result of the control experiment explained in connection with Evaluating Experiment 4. As compared with the control experiment, in the case where the infrared light irradiation time in the PAB process was 50 seconds, the average value of the LWRs was larger. On the other hand, in the cases where the infrared light irradiation time was 60 seconds and 70 seconds, the average value of LRWs was smaller than that of the control experiment. Thus, the result of Evaluating Experiment 5 showed that the combination of the methods of the first and second embodiments could improve the LWR. Also in Evaluating Experiment 5, it was confirmed that the longer the infrared light irradiation time was, the smaller the CD was.

TABLE 4

|  | Control Experiment | Evaluating Experiment 5 | | |
|---|---|---|---|---|
| Process Time (second) | 60 | 50 | 60 | 70 |
| CD (nm) | 42.3 | 50.7 | 48.7 | 44.2 |
| LWR (nm) | 2.8 | 3.3 | 2.6 | 2.4 |
|  | 2.6 | 2.9 | 2.3 | 2.6 |
|  | 2.9 | 3.3 | 2.4 | 2.7 |
|  | 2.7 | 3.4 | 2.6 | 2.5 |
|  | 2.8 | 3.3 | 2.7 | 2.6 |
|  | 2.8 | 2.8 | 2.4 | 2.6 |
|  | 3.0 | 3.3 | 2.7 | 2.7 |
|  | 3.0 | 3.1 | 2.8 | 3.0 |
|  | 3.0 | 3.0 | 2.5 | 2.9 |
|  | 3.1 | 2.8 | 2.9 | 3.1 |
| Average Value (nm) | 2.87 | 3.27 | 2.59 | 2.71 |

(Evaluating Experiment 6)

In Evaluating Experiment 6, similarly to Evaluating Experiment 1, each resist pattern was formed under the condition that an exposed wafer W placed on the cooling plate was irradiated with infrared light, and then the wafer W was transferred to the heating plate 25 and subjected to the PEB process. The infrared light irradiation time of the respective wafer was changed within a range from 60 seconds to 300 seconds. The heating time by the heating plate 25 was 60 seconds. Similarly to Evaluating Experiments 3 to 5, the LWRs of the formed resist pattern in various positions of each wafer W were measured, and an average value thereof was calculated. In addition, the CD of the resist pattern was measured.

Table 5 below shows the result of Evaluating Experiment 6. Table 5 shows the result of the control experiment explained in connection with Evaluating Experiment 4. In the case where the infrared light irradiation time was 300 seconds, the average value of LWRs was larger than that of the control experiment. On the other hand, in the cases where the infrared light irradiation time was 60 seconds and 180 seconds, the average value of LWRs was smaller than that of the control experiment. Thus, the result of Evaluating Experiment 6 showed that the roughness of the resist pattern 54 could be suppressed by irradiating the exposed wafer W with infrared light for an appropriated period of time. In addition, the longer the infrared light irradiation time was, the smaller the CD was. Thus, it can be considered that the longer infrared light irradiation time results in further progress of the acid flow in the resist film 41 flow, as described above. Evaluating Experiment 6 and Evaluating Experiment 3 showed that, if the exposed wafer W was irradiated with infrared light, the irradiation might be performed during the heating of the wafer W or before the heating process.

TABLE 5

|  | Control Experiment | Evaluating Experiment 6 | | |
|---|---|---|---|---|
| Process Time (second) | 60 | 60 | 180 | 300 |
| CD (nm) | 42.3 | 48.5 | 44.5 | 41.3 |
| LWR (nm) | 2.8 | 2.6 | 2.7 | 3.3 |
|  | 2.6 | 2.2 | 2.6 | 4.1 |
|  | 2.9 | 2.2 | 2.6 | 3.3 |
|  | 2.7 | 2.5 | 2.8 | 4.0 |
|  | 2.8 | 2.8 | 2.5 | 3.5 |
|  | 2.8 | 2.8 | 2.6 | 3.3 |
|  | 3.0 | 2.3 | 2.7 | 3.4 |
|  | 3.0 | 2.9 | 2.9 | 4.3 |

TABLE 5-continued

|  | Control Experiment | Evaluating Experiment 6 | | |
| --- | --- | --- | --- | --- |
| Process Time (second) | 60 | 60 | 180 | 300 |
|  | 3.0 | 2.5 | 2.5 | 4.1 |
|  | 3.1 | 2.8 | 2.7 | 3.6 |
| Average Value (nm) | 2.87 | 2.55 | 2.64 | 3.72 |

(Evaluating Experiment 7)

In Evaluating Experiment 7, similarly to Evaluating Experiment 3, a resist pattern 54 was formed on each exposed wafer W under the condition that each exposed wafer W was irradiated with the infrared light of the aforementioned wavelengths while being heated. The infrared light irradiation time of the respective wafers W was changed at 10 second intervals within the range from 40 seconds to 70 seconds. In Evaluating Experiment 7, an apparatus having a KrF light source was used as the exposure apparatus D4. A resist developed for EUV exposure was used as the resist. In Evaluating Experiment 7, different positions of one wafer W were exposed with different dose amounts. The CD and the LWR of the resist pattern 54 were measured, and the dose amount (adequate dose amount) at which the target value of CD of the resist pattern 54 was achieved was examined. As a control experiment, a wafer W was processed similarly to Evaluating Experiment 7 to form the resist pattern 54, excluding that the wafer W was not irradiated with the infrared light. Similarly to Evaluating Experiment 7, the CD, the LWR and the adequate dose amount were examined.

Figure 27:
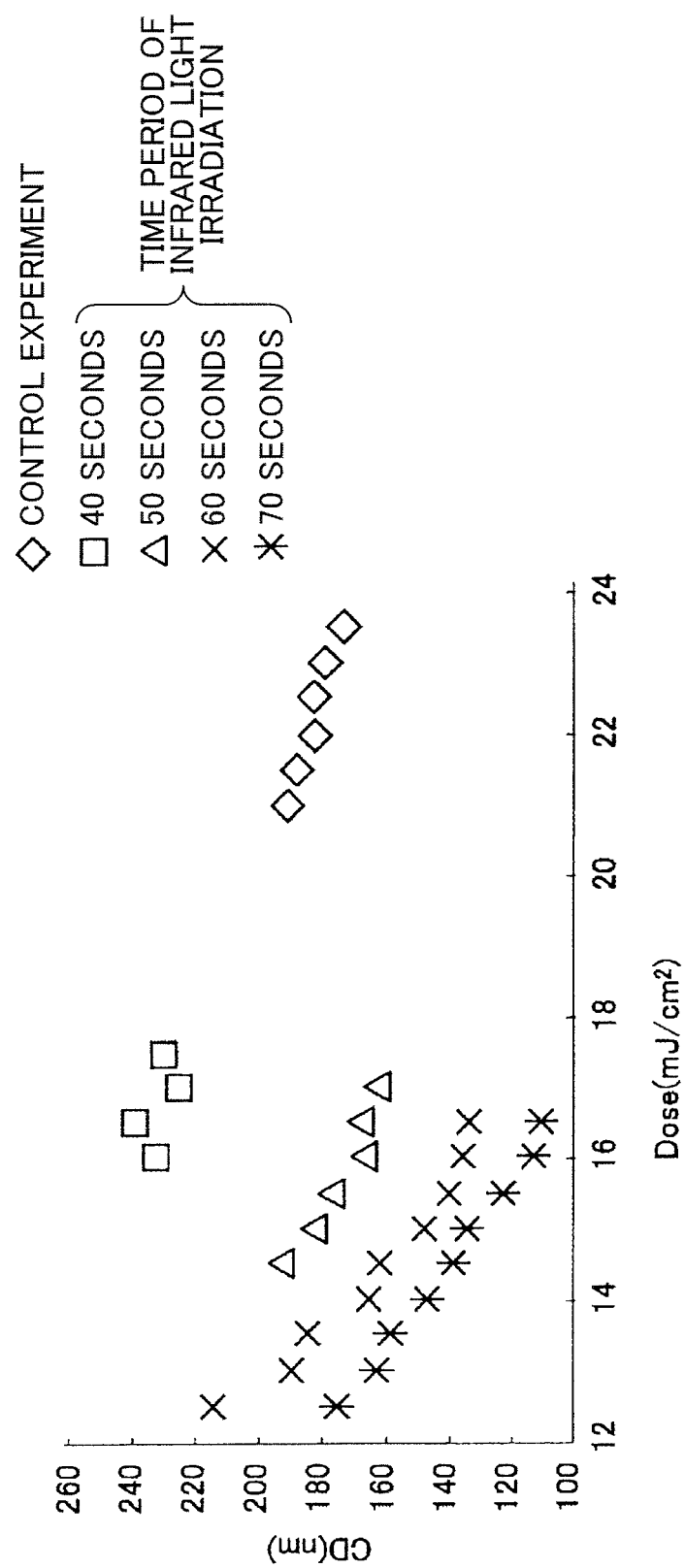
FIG. 27 is a graph showing the result of the evaluating experiments.
Figure 28:
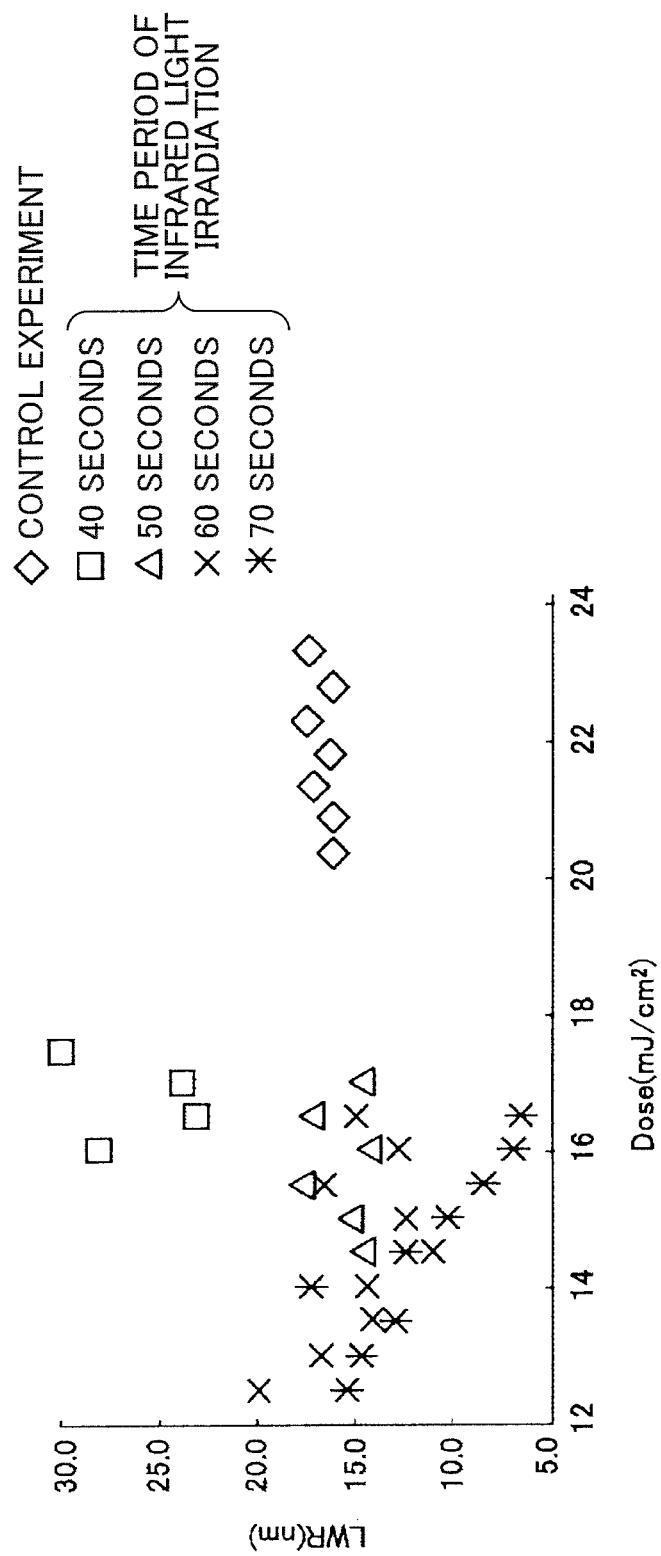
FIG. 28 is a graph showing the result of the evaluating experiments.

Table 6 below shows the result of Evaluating Experiment 7. Table 6 shows the adequate dose amount, the sensitivity improvement rate, the average value of LWRs and the minimum value of LWRs, for each infrared light irradiation time. The sensitivity improvement rate is calculated by the expression $(Z-Y)/Y \times 100$, where Y is the adequate dose amount when the infrared light irradiation time is X, and Z is the adequate dose amount in the control experiment. The result of Evaluating Experiment 7 is shown in the graphs of FIGS. 27 and 28. In the graph of FIG. 27, the axis of coordinate shows the measured CD and the axis of abscissa shows the dose amount during the exposure. In the graph of FIG. 28, the axis of coordinate shows the average value of LWRs and axis of abscissa shows the dose amount.

TABLE 6

|  | Control Experiment | Time Period of Infrared Light Irradiation (second) | | | |
| --- | --- | --- | --- | --- | --- |
|  |  | 40 | 50 | 60 | 70 |
| Adequate Dose Amount (mJ/cm$^2$) | 26.5 | 31.1 | 17.7 | 15.1 | 13.9 |
| Sensitivity Improvement Rate (%) | 0.0 | −17.3 | 33.2 | 43.0 | 47.7 |
| Average Value of LWRs (nm) | 16.5 | 26.3 | 15.5 | 14.8 | 13.0 |
| Minimum Value of LWRs (nm) | 15.9 | 23.1 | 14.2 | 11.1 | 10.5 |

As shown in Table 6, FIGS. 27 and 28, if the time periods of infrared light irradiation are 50 seconds, 60 seconds and 70 seconds, the sensitivity improvement rate is high, and the average value and the minimum value of LWRs are smaller than those in the control experiment. Thus, the result of Evaluating Experiment 7 showed that the LWR could be improved by the method of the first embodiment, and that sensitivity of the resist film to light exposure could be enhanced.

W Wafer
1 Coating and developing apparatus
2 Heating module
25 Heating plate
24 Cooling plate
34 Infrared lamp
36 Filter
41 Resist film
51 Exposed area
52 Light-shielded area
53 Intermediate area

The invention claimed is:

1. A resist pattern forming method comprising:
    a step of applying a chemically amplified resist to a substrate thereby forming a resist film on the substrate;
    a step of, after the step of applying the chemically amplified resist, exposing the resist film formed on the substrate thereby forming a latent image of a pattern;
    a step of, after the step of exposing the resist film, irradiating from a first heating source the resist film with infrared light of wavelengths within a wavelength range from about 2.0 μm to about 6.0 μm such that the entire surface of the substrate having the resist film thereon is irradiated with the infrared light substantially uniformly and the resist film is not substantially irradiated with infrared light of wavelengths outside the wavelength range;
    a step of, after the step of irradiating the resist film with the infrared light, heating the substrate by means of a second heating source that is different from the first heating source thereby diffusing acids that are produced in the resist film by the exposing; and
    a step of, after the step of heating the substrate, forming a pattern of the resist film by supplying a developer to the substrate.

2. The resist pattern forming method according to claim 1, wherein the second heating source is a heating plate on which the substrate is placed.

3. The resist pattern forming method according to claim 2, wherein the step of irradiating the resist film with the infrared light is performed with the substrate being placed on and heated by the heating plate.

4. The resist pattern forming method according to claim 2, wherein the step of irradiating the resist film with the infrared light is performed to the substrate with the substrate being placed on a moving part that is moving to transport the substrate to the heating plate.

5. The resist pattern forming method according to claim 1, wherein:
    the first heating source is composed of an infrared light irradiating unit, and an infrared light filter positioned in a light path of the infrared light extending from the irradiating unit toward the substrate;
    the second heating source is composed of the infrared light irradiating unit under the condition where the infrared light filter is moved to a position removed from the light path; and the method further includes a step of shifting from the irradiating of the infrared light by the first heating source to the heating by the second heating source by moving the filter relative to the light path of the infrared light.

6. A resist pattern forming method comprising:
a step of applying a resist to a substrate thereby forming a resist film on the substrate;
a step of, after the step of applying the resist, irradiating from a first heating source the resist film formed on the substrate with infrared light of wavelengths within a wavelength range from about 2.0 µm to about 6.0 µm such that the entire surface of the substrate having the resist film thereon is irradiated with the infrared light substantially uniformly and the resist film is not substantially irradiated with infrared light of wavelengths outside the wavelength range, and heating the substrate, being irradiated with the infrared light, by means of a second heating source that is different from the first heating source thereby drying the resist film;
a step of, after the step of irradiating the resist film with the infrared light and heating the substrate being irradiated with the infrared light, exposing the resist film on the substrate thereby forming a latent image of a pattern;
a step of, after the step of exposing the resist film, heating the substrate; and
a step of, after the step of heating the substrate, forming a pattern of the resist film by supplying a developer to the substrate.

7. The resist pattern forming method according to claim 6, wherein the second heating source is a heating plate on which the substrate is placed.

8. The resist pattern forming method according to claim 7, wherein the step of irradiating the resist film with the infrared light is performed with the substrate being placed on and heated by the heating plate.

9. The resist pattern forming method according to claim 7, wherein the step of irradiating the resist film with the infrared light is performed to the substrate with the substrate being placed on a moving part that is moving to transport the substrate to the heating plate.

* * * * *